US009450610B1

(12) United States Patent
Micheloni et al.

(10) Patent No.: US 9,450,610 B1
(45) Date of Patent: *Sep. 20, 2016

(54) HIGH QUALITY LOG LIKELIHOOD RATIOS DETERMINED USING TWO-INDEX LOOK-UP TABLE

(71) Applicant: Microsemi Storage Solutions (US), Inc., Aliso Viejo, CA (US)

(72) Inventors: Rino Micheloni, Turate (IT); Alessia Marelli, Dalmine (IT); Christopher I. W. Norrie, San Jose, CA (US)

(73) Assignee: Microsemi Storage Solutions (US), Inc., Aliso Viejo, CA (US)

( * ) Notice: Subject to any disclaimer, the term of this patent is extended or adjusted under 35 U.S.C. 154(b) by 46 days.

This patent is subject to a terminal disclaimer.

(21) Appl. No.: 14/557,214

(22) Filed: Dec. 1, 2014

Related U.S. Application Data

(63) Continuation-in-part of application No. 14/210,067, filed on Mar. 13, 2014.

(60) Provisional application No. 61/793,198, filed on Mar. 15, 2013.

(51) Int. Cl.
  *H03M 13/00* (2006.01)
  *H03M 13/11* (2006.01)
  *G06F 11/10* (2006.01)

(52) U.S. Cl.
  CPC ...... *H03M 13/1125* (2013.01); *G06F 11/1048* (2013.01); *G06F 11/1072* (2013.01); *H03M 13/1108* (2013.01)

(58) Field of Classification Search
  None
  See application file for complete search history.

(56) References Cited

U.S. PATENT DOCUMENTS

| | | |
|---|---|---|
| 815,137 A | 3/1906 | Beecher |
| 5,615,235 A | 3/1997 | Kakuishi et al. |
| 5,732,092 A | 3/1998 | Shinohara |
| 5,875,343 A | 2/1999 | Binford et al. |
| 6,115,788 A | 9/2000 | Thowe |
| 6,539,515 B1 | 3/2003 | Gong |
| 6,633,856 B2 | 10/2003 | Richardson et al. |
| 6,725,409 B1 | 4/2004 | Wolf |
| 6,789,227 B2 | 9/2004 | De Souza et al. |

(Continued)

OTHER PUBLICATIONS

NVM Express, Revision 1.0; Intel Corporation; Mar. 1, 2011.

(Continued)

*Primary Examiner* — M. Mujtaba Chaudry
(74) *Attorney, Agent, or Firm* — Glass and Associates; Kenneth Glass

(57) ABSTRACT

A nonvolatile memory controller includes memory storage configured to store a two-index look-up table that includes a Log-Likelihood Ratio (LLR), hard-and-soft-decision bits associate with the LLR and a neighboring cell read pattern associated with the LLR. Read circuitry is configured to perform a plurality of reads of a cell of a nonvolatile memory storage module at different read voltage levels to generate target cell hard-and-soft-decision bits and configured to read neighboring cells to generate neighboring cell reads. Neighboring cell processing circuitry combines the neighboring cell reads to generate a neighboring cell read pattern. Look-up circuitry accesses the two-index look-up table using the target cell hard-and-soft-decision bits and the neighboring cell read pattern to identify the corresponding LLR for use in Low-Density Parity Check (LDPC) decoding of a codeword stored in the nonvolatile memory storage module.

20 Claims, 26 Drawing Sheets

(56) References Cited

U.S. PATENT DOCUMENTS

| | | |
|---|---|---|
| 6,895,547 B2 | 5/2005 | Eleftheriou et al. |
| 6,934,804 B2 | 8/2005 | Hashemi |
| 6,976,194 B2 | 12/2005 | Cypher |
| 6,976,197 B2 | 12/2005 | Faust et al. |
| 7,116,732 B2 | 10/2006 | Worm et al. |
| 7,206,992 B2 | 4/2007 | Xin et al. |
| 7,209,527 B2 | 4/2007 | Smith et al. |
| 7,237,183 B2 | 6/2007 | Xin |
| 7,324,559 B2 | 1/2008 | McGibney |
| 7,450,668 B2 | 11/2008 | Ghosh et al. |
| 7,457,906 B2 | 11/2008 | Pettey et al. |
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,620,784 B2 | 11/2009 | Panabaker et al. |
| 7,694,047 B1 | 4/2010 | Alston |
| 7,708,195 B2 | 5/2010 | Yoshida et al. |
| 7,739,472 B2 | 6/2010 | Guterman et al. |
| 7,752,346 B2 | 7/2010 | Talayco et al. |
| 7,801,233 B1 | 9/2010 | Chow et al. |
| 7,860,930 B2 | 12/2010 | Freimuth et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B2 | 3/2012 | Maru |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 | 7/2012 | Yang et al. |
| 8,244,946 B2 | 8/2012 | Gupta et al. |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,261,136 B2 | 9/2012 | D'Abreu et al. |
| 8,281,217 B2 | 10/2012 | Kim et al. |
| 8,281,227 B2 | 10/2012 | Inskeep et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,359,522 B2 | 1/2013 | Gunnam et al. |
| 8,392,789 B2 | 3/2013 | Biscondi et al. |
| 8,402,201 B2 | 3/2013 | Strasser et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,473,812 B2 | 6/2013 | Ramamoorthy et al. |
| 8,493,791 B2 * | 7/2013 | Karakulak ......... G11C 16/3431 365/185.02 |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,739,008 B2 | 5/2014 | Liu et al. |
| 8,769,374 B2 | 7/2014 | Franceschini et al. |
| 8,775,913 B2 | 7/2014 | Haratsch et al. |
| 8,787,428 B2 | 7/2014 | Dai et al. |
| 8,856,622 B2 | 10/2014 | Ramamoorthy et al. |
| 8,898,372 B2 | 11/2014 | Yeh |
| 8,917,734 B1 | 12/2014 | Brown |
| 8,924,824 B1 * | 12/2014 | Lu ..................... G06F 11/1048 365/185.2 |
| 8,958,247 B2 | 2/2015 | Asaoka et al. |
| 8,995,302 B1 | 3/2015 | Brown et al. |
| 9,025,495 B1 | 5/2015 | Onufryk et al. |
| 9,058,289 B2 * | 6/2015 | Tai ..................... G06F 11/1048 |
| 9,294,132 B1 | 3/2016 | Peleato-Inarrea |
| 2002/0051501 A1 | 5/2002 | Demjanenko et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0181735 A1 | 9/2004 | Xin |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0252791 A1 | 11/2005 | Pechtold et al. |
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0233939 A1 | 10/2007 | Kim |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0141139 A1 | 6/2012 | Bakhru et al. |
| 2012/0166690 A1 | 6/2012 | Regula |
| 2012/0311402 A1 | 12/2012 | Tseng et al. |

(56) References Cited

U.S. PATENT DOCUMENTS

| | | |
|---|---|---|
| 2013/0013983 A1 | 1/2013 | Livshitz et al. |
| 2013/0086451 A1 | 4/2013 | Grube et al. |
| 2013/0117616 A1* | 5/2013 | Tai .................. G06F 11/1048 714/718 |
| 2013/0117640 A1* | 5/2013 | Tai .................. G06F 11/1048 714/780 |
| 2013/0145235 A1 | 6/2013 | Alhussien et al. |
| 2013/0163327 A1* | 6/2013 | Karakulak ......... G11C 16/3431 365/185.02 |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0315252 A1 | 11/2013 | Emmadi et al. |
| 2013/0318422 A1 | 11/2013 | Weathers et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0181617 A1 | 6/2014 | Wu et al. |
| 2014/0185611 A1 | 7/2014 | Lie et al. |
| 2014/0198581 A1 | 7/2014 | Kim et al. |
| 2014/0281767 A1 | 9/2014 | Alhussien et al. |
| 2014/0281822 A1 | 9/2014 | Wu et al. |
| 2014/0281823 A1 | 9/2014 | Micheloni et al. |
| 2015/0149871 A1 | 5/2015 | Chen et al. |
| 2015/0186055 A1 | 7/2015 | Darragh |

OTHER PUBLICATIONS

NVM Express, revision 1.0; Intel Corporation; pp. 103-106 and 110-114; Jul. 12, 2011.

* cited by examiner

1800

| 1801 | 1802 | 1803 |
|---|---|---|
| TARGET CELL HARD-AND-SOFT-DECISION BITS$_1$ | NEIGHBORING CELL READ PATTERN$_1$ | LLR$_1$ |
| TARGET CELL HARD-AND-SOFT-DECISION BITS$_2$ | NEIGHBORING CELL READ PATTERN$_2$ | LLR$_2$ |
| TARGET CELL HARD-AND-SOFT-DECISION BITS$_3$ | NEIGHBORING CELL READ PATTERN$_3$ | LLR$_3$ |
| ⋮ | ⋮ | ⋮ |
| TARGET CELL HARD-AND-SOFT-DECISION BITS$_N$ | NEIGHBORING CELL READ PATTERN$_N$ | LLR$_N$ |

| 1801 | | | 1802 | | | | | | | 1803 |
|---|---|---|---|---|---|---|---|---|---|---|
| $X_1$ | $XMSB_1$ | $XLSB_1$ | $XY1_1$ | $YU_1$ | $XY2_1$ | $XR_1$ | $XY4_1$ | $YD_1$ | $XY3_1$ | $XL_1$ | $LLR_1$ |
| $X_2$ | $XMSB_2$ | $XLSB_2$ | $XY1_1$ | $YU_2$ | $XY2_2$ | $XR_2$ | $XY4_2$ | $YD_2$ | $XY3_2$ | $XL_2$ | $LLR_2$ |
| $X_3$ | $XMSB_2$ | $XLSB_2$ | $XY1_1$ | $YU_3$ | $XY2_3$ | $XR_3$ | $XY4_3$ | $YD_3$ | $XY3_3$ | $XL_3$ | $LLR_3$ |
| | | | | | ⋮ | | | | | |
| $X_N$ | $XMSB_N$ | $XLSB_N$ | $XY1_N$ | $YU_N$ | $XY2_N$ | $XR_N$ | $XY4_N$ | $YD_N$ | $XY3_N$ | $XL_N$ | $LLR_N$ |

FIG. 21

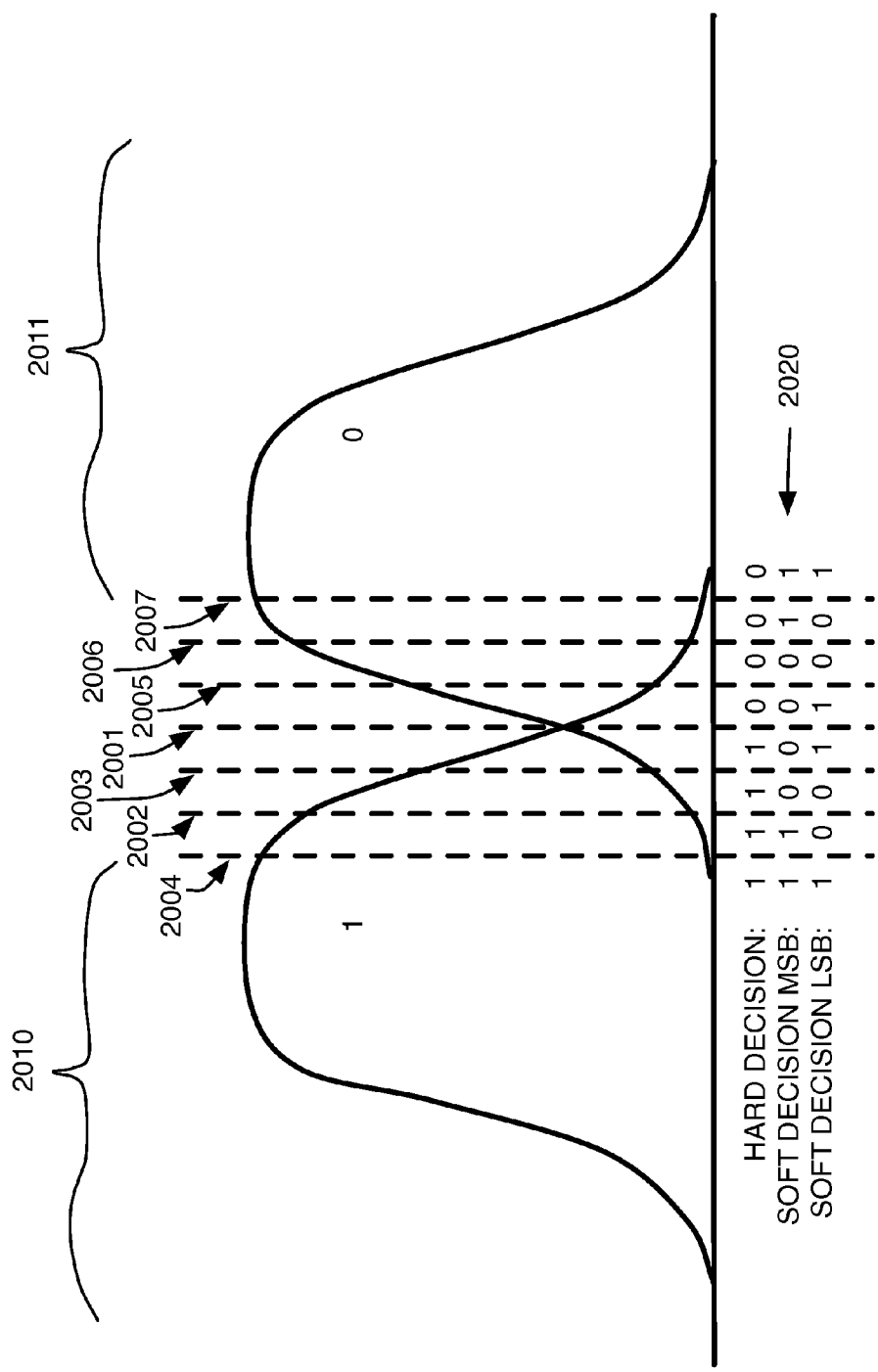

| 1801 | 1802 | 1803 |
|---|---|---|
| 001 | 1111111 | $LLR_1$ |
| 001 | 1111110 | $LLR_2$ |
| 001 | 1111100 | $LLR_3$ |
| 001 | 1111000 | $LLR_4$ |
| 001 | 1111010 | $LLR_5$ |

| | | |
|---|---|---|
| 001 | 1111111 | $LLR_{256}$ |
| 110 | 1111110 | $LLR_{257}$ |
| 110 | 1111100 | $LLR_{258}$ |
| 110 | 1111000 | $LLR_{259}$ |
| 110 | 1111010 | $LLR_{260}$ |
| 110 | 1101000 | $LLR_{261}$ |
| 110 | 1101010 | $LLR_{262}$ |
| 110 | 0000000 | $LLR_{263}$ |
| 110 | 0100000 | $LLR_{264}$ |

| | | |
|---|---|---|
| 110 | 1111111 | $LLR_{2048}$ |

HIGH QUALITY LOG LIKELIHOOD RATIOS DETERMINED USING TWO-INDEX LOOK-UP TABLE

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column. Various methods for decoding data encoded with LDPC error correction codes are known in the art. One commonly employed decoding method for LDPC coding is the layered min-sum algorithm (MSA). While the min-sum algorithm is an approximation of the quasi-optimal decoding method of belief propagation, the layered min-sum algorithm introduces a further hardware simplification. The layered min-sum algorithm is iterative by layer and is based on belief propagation. The layered min-sum algorithm (MSA) is less complex than other decoding methods known in the art. However, the min-sum algorithm exhibits a noticeable degradation in the decoding performance compared to the more complex decoding methods, such as belief propagation. To counteract the degradation in the decoding performance achievable with the layered min-sum algorithm, normalized layered min-sum algorithms have been developed incorporating a normalization factor, or attenuation factor, to account for the degradation in decoding performance.

The power of LDPC codes resides in the ability of the decoding strategy to exploit the soft information on the stored data. In LDPC decoding, the two voltage distributions represent the two possible states: "0" and "1", of the cells within the NAND chips. Soft information for the stored data is expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. The sign of the LLR typically provides the bit estimation (i.e. positive LLR corresponds to 0 and negative LLR corresponds to 1). The magnitude of the LLR provides the reliability of the estimation (i.e. $|LLR|=0$ means that the estimation is completely unreliable and $|LLR|=\infty$ means that the estimation is completely reliable and the bit value is known).

Reading soft information from the NAND chips requires multiple reads at varying reference voltages. Performing multiple reads is time consuming and has a severe negative impact on the performance of the flash memory controller. As such, it is desirable to reduce the number of reads required to obtain quality LLR data that will be useful in the decoding process.

Accordingly, what is needed in the art is an improved system and method for higher quality log likelihood ratio (LLRs) to be used in the decoding of LDPC encoded.

SUMMARY

A method of providing one or more log likelihood ratio (LLRs) of a target cell to a low-density parity check (LDPC) decoder is disclosed that includes storing one or more two-index LLR look-up table in a memory controller. The two-index LLR look-up table may include a LLR, the hard-and-soft-decision bits associate with the LLR and the neighboring cell read pattern associated with the LLR. A plurality of reads of a cell of a nonvolatile memory storage module are performed at different read voltage levels to generate a plurality of target cell hard-and-soft-decision bits associated with a bit stored in the cell. Reads of neighboring cells are performed to generate neighboring cell reads, where each of the neighboring cell reads are associated with a bit stored in one of the neighboring cells. The neighboring cell reads are combined to generate a neighboring cell read pattern that corresponds to the pattern of the neighboring cell reads. The one or more look-up table is then accessed using the plurality of target cell hard-and-soft-decision bits and the neighboring cell read pattern to identify the corresponding LLR. The identified LLR is then sent to a Low-Density Party Check (LDPC) decoder for decoding of a codeword stored in the nonvolatile memory storage module.

A nonvolatile memory controller is disclosed that includes memory storage configured to store one or more two-index LLR look-up table that includes a LLR, hard-and-soft-decision bits associated with the LLR and a neighboring cell read pattern associated with the LLR. The nonvolatile memory controller also includes read circuitry configured to perform a plurality of reads of a cell of a nonvolatile memory storage module at different read voltage levels to generate a plurality of target cell hard-and-soft-decision bits associated with a bit stored in the cell and configured for performing reads of neighboring cells to generate a plurality of neighboring cell reads, each of the plurality of neighboring cell reads associated with a bit stored in one of the neighboring cells. The nonvolatile memory controller includes neighboring cell processing circuitry configured to combine the neighboring cell reads to generate a neighboring cell read pattern that corresponds to the pattern of the neighboring cell reads. Look-up circuitry that is coupled to the neighboring cell circuitry and the read circuitry is configured to access the two-index LLR look-up table using the plurality of target cell hard-and-soft-decision bits associated with a bit stored in the cell and the neighboring cell read pattern that corresponds to the pattern of the neighboring cell reads to identify the corresponding LLR for use in LDPC decoding of a codeword stored in the nonvolatile memory storage module.

Since the LLR's provided to the LDPC decoder correspond to both the soft information and neighboring cell read pattern, the LLRs are higher quality than those generated using conventional methods. The high quality LLRs of the present invention provide improved decoding performance, resulting in a faster convergence or enabling a previously unavailable solution. The higher quality LLR values of the present invention increase the likelihood of determining a correct codeword during the decode process.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 18 is an illustration of a two-index LLR look-up table in accordance with an embodiment of the present invention.

FIG. 20 is a graphical illustration of an exemplary threshold voltage distribution for a single-level cell that illustrates three soft-decision bit values that correspond to the different regions of the threshold voltage distribution.

FIG. 21 is a detailed illustration of a two-index LLR look-up table in accordance with an embodiment of the present invention.

FIG. 22 is a detailed illustration of an exemplary two-index LLR look-up table in accordance with an embodiment of the present invention.

FIG. 26 is a block diagram illustrating exemplary patterns that can be combined in the neighboring cell pattern look-up table in accordance with an embodiment of the present invention.

DETAILED DESCRIPTION

In the operation of a stored channel utilizing LDPC encoding, original data is stored in a nonvolatile memory system. Different noise sources, estimated as a White Gaussian Noise (AWGN) Channel, corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

Figure 1:
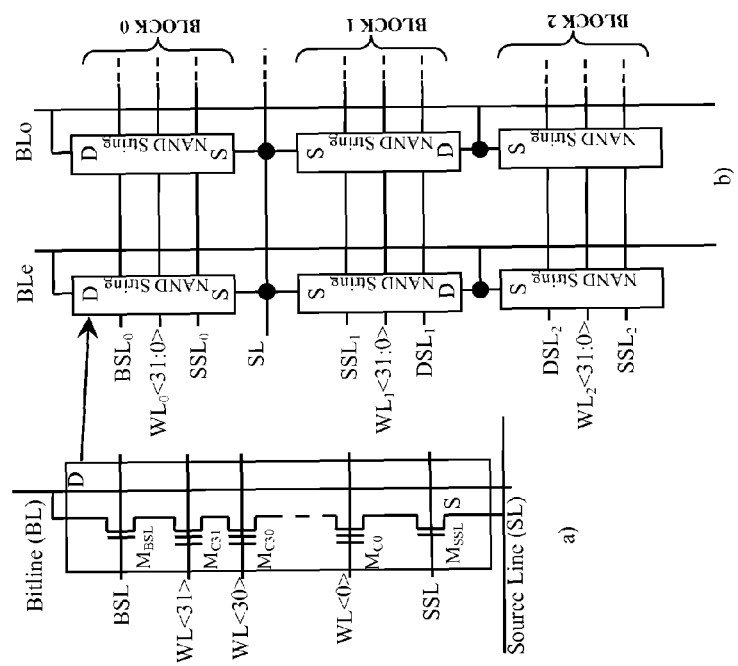
FIG. 1 is circuit diagram illustrating a NAND string and a NAND array architecture.

The nonvolatile memory system may be a NAND-based flash memory system. NAND flash memories are nonvolatile, and as such, are able to store and keep data even in the absence of a power source. With reference to FIG. 1, the basic elements of a flash memory are the nonvolatile memory cells, which are usually connected in series to form a string. Typically a string is composed of 32 or 64 cells in series. FIG. 1(a) illustrates the case wherein 32 cells ($M_{C0}$ to $M_{C31}$) are connected in series. Two selection transistors are placed at the edge of the string of cells. Selection transistor $M_{SSL}$ ensures the connection to the source line, while selection transistor $M_{BSL}$ connects the string to the bitline (BL). The control gates of the cells are connected through the wordlines (WLs). FIG. 1(b) illustrates how the matrix array of cells is built, beginning with a string. In the WL direction, adjacent NAND strings share the same WL, DSL, BSL and SL. In the BL direction, two consecutive strings share the BL contact.

In NAND based memories, a flash block is composed of the NAND strings that share the same group of WLs. FIG. 1(b) illustrates three blocks: BLOCK0 is made up of $WL_0<31:0>$, BLOCK1 is made up of $WL_1<31:0>$ and BLOCK2 is made up of $WL_2<31:0>$.

In NAND based memories, a logical page is composed of cells belonging to the same WL. The number of pages per WL is related to the storage capability of the memory cell. Depending upon the number of storage levels, flash memories are referred to in different ways: SLC (single level cell) memories store 1 bit per cell, MLC (multi-level cell) memories store 2 bits per cell, 8LC (eight level cell or triple level cell) memories store 3 bits per cell and 16LC (sixteen level cell) memories store 4 bits per cell.

Considering the SLC case with interleaved architecture, wherein one page is composed of even cells and a second page is composed of odd cells, as shown in FIG. 1(b), if the page size is 4 kB, it follows that a WL has 32,768+32, 768=65,536 cells. In contrast, in the MLC case, there are four pages, as each cell stores one least significant bit (LSB) and one most significant bit (MSB).

In general, a logical page is the smallest addressable unit for reading from and writing to the NAND memory. The number of logical pages within a logical block is typically a multiple of 16 (e.g. 64, 128). Additionally, in a NAND based memory, a logical block is the smallest erasable unit.

Figure 2:
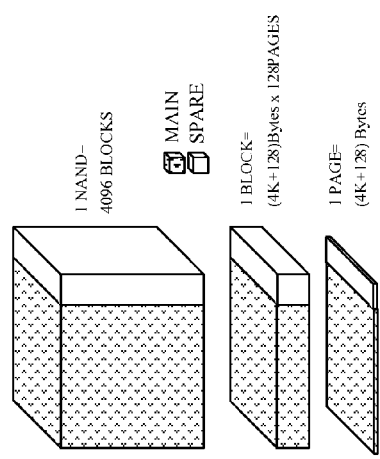
FIG. 2 is an illustration of a 16 GBit memory logic organization.

As shown with reference to FIG. 2, each page of the NAND memory is composed of a main data area and a spare area. The main area may have the size of 4 kB, 8 kB or 16 kB. The spare area can be used to store error correction codes (ECC) and is made up of hundreds of bytes for every 4 kB of main data area.

FIG. 2 illustrates the logical organization of an SLC device with a string of 64 cells, interleaving architecture and 4 kB page (plus 128B of spare area per page). Each logical block contains 128 pages with a total of 512 kB per block. It follows that for a 4 GB (16 Gbit) memory, 4096 block are needed for storage.

While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column.

Figure 3:
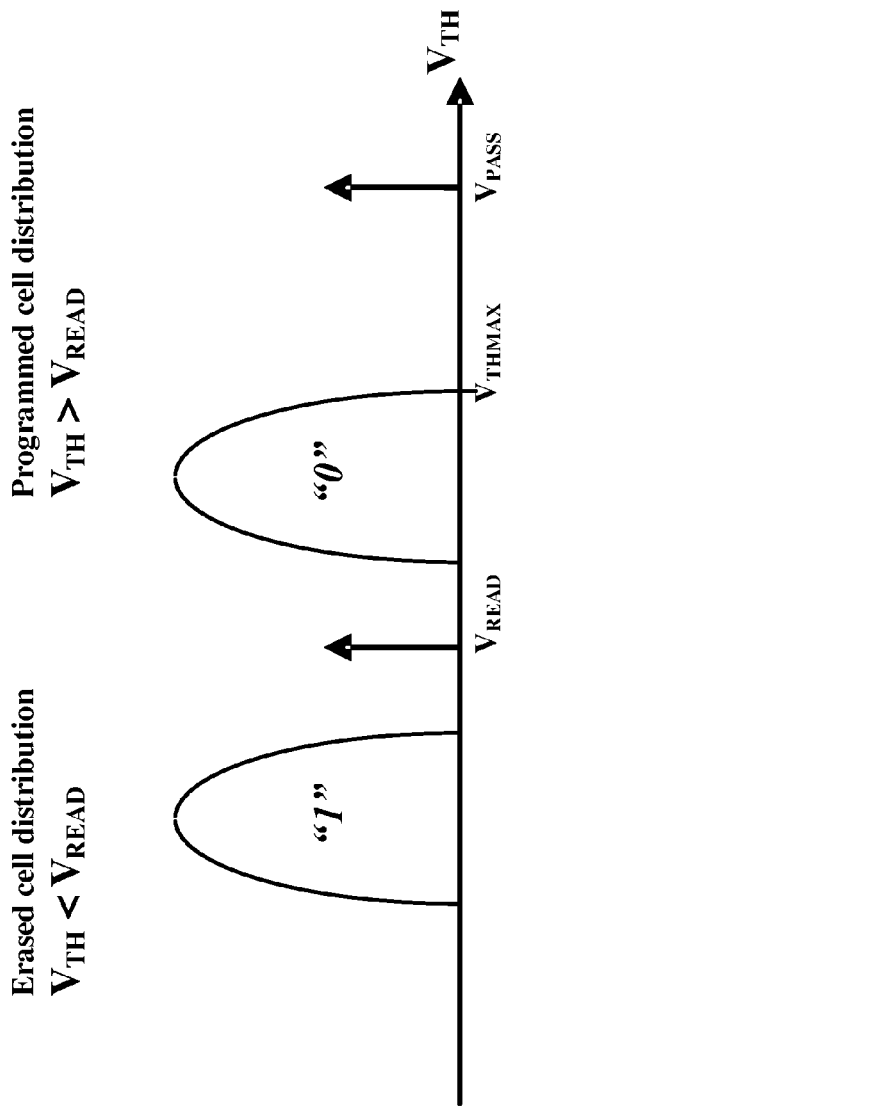
FIG. 3 is a graphical illustration of a single level cell distribution in a NAND cell.

FIG. 3 illustrates an ideal distribution level for an SLC device, wherein $V_{READ}$ is the voltage level used during the read operation of the device. As shown, if the cell has a threshold voltage of less than $V_{READ}$ it is a "1" and if the cell has a threshold voltage higher than $V_{READ}$ it is a "0". However, the ideal distribution of a SLC device is influenced by the data programmed into the adjoining cells in the device. One of the largest contributing factors affecting the distribution width is the cell-to-cell floating gate coupling.

Figure 4:
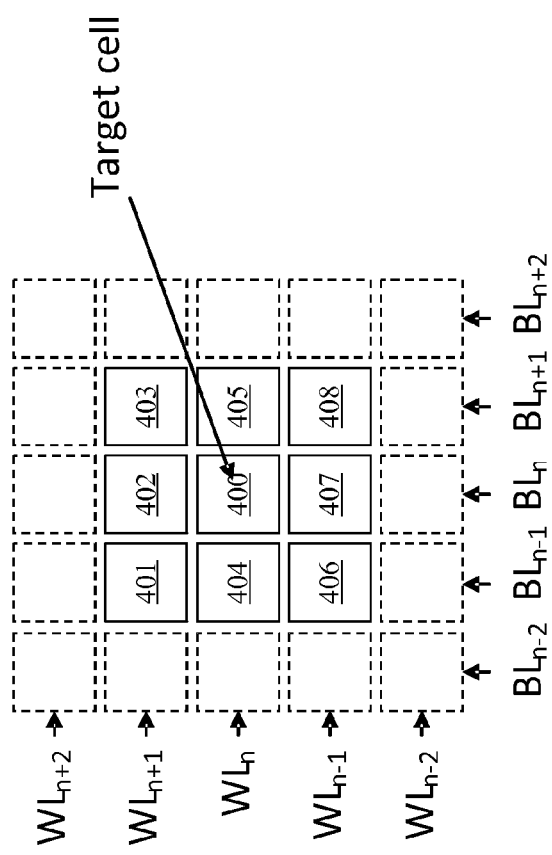
FIG. 4 is an illustration of a target cell and its surrounding cells.
Figure 5:
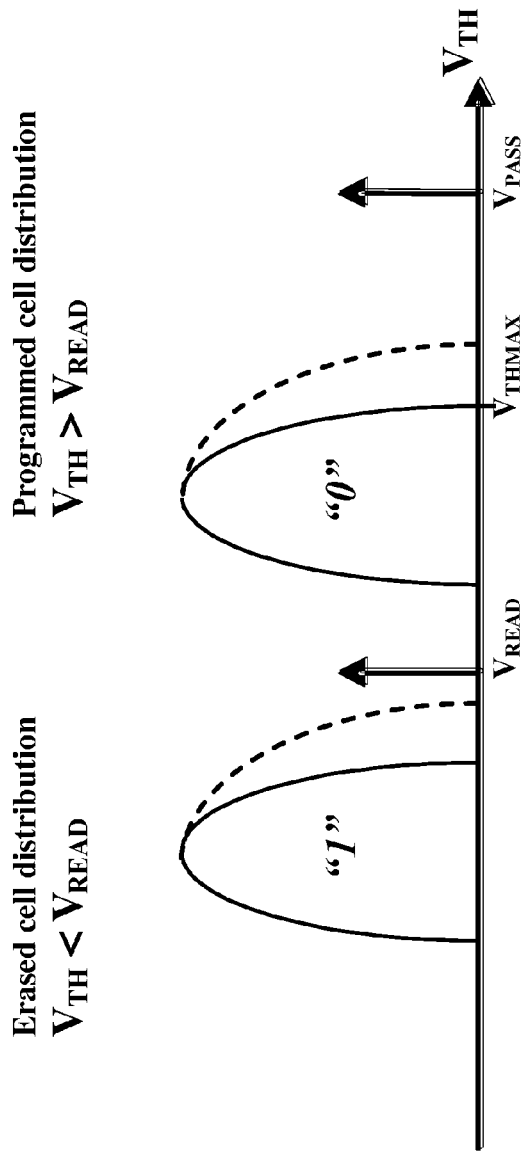
FIG. 5 is a graphical illustration of a target cell distribution after surrounding cell programming has occurred.

FIG. 4 illustrates a target cell 400 surrounded by its 8-most neighboring cells 401, 402, 403, 404, 405, 406, 407, 408. Due to the nature of the NAND architecture, coupling capacitance exists between the target cell 400 and the neighboring cells 401, 402, 403, 404, 405, 406, 407, 408. Depending upon the data to be programmed into the cell, the target cell 400 is programmed to a distribution "0" or remains in the erased state "1". Sequentially, surrounding cells (or a subset of surrounding cells) are programmed to their target distributions. Surrounding cells (or a subset of surrounding cells) move from the erased distribution to the written distribution. As a result of this, there is a change in the electric field of the target cell 400. This electric field is reflected as a voltage threshold shift for the target cell 400 that appears "more programmed". As a result, the target cell's 400 distribution experiences an enlargement on the right side of the distribution curve, as illustrated by the dotted lines in FIG. 5. As such, if a target cell, belonging to the "1" distribution, crosses the $V_{READ}$ level after the programming of the surrounding cells, it will be read in error as a "0".

Figure 6:
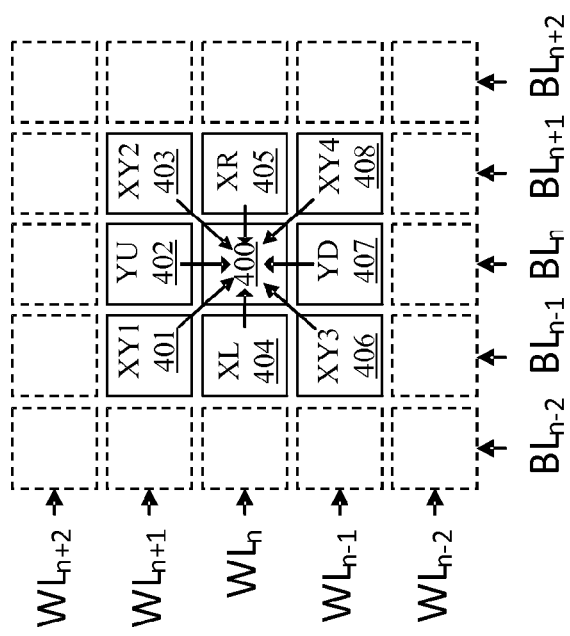
FIG. 6 is an illustration of the coupling coefficients of neighboring cells to a target cell in accordance with an embodiment of the present invention.

Each of the cells 401, 402, 403, 404, 405, 406, 407, 408 surrounding the target cell 400 contributes to the distribution of the target cell 400, depending upon the capacitive coupling ratio between the target cell 400 and the neighboring cells 401, 402, 403, 404, 405, 406, 407, 408. For each neighboring cell 401, 402, 403, 404, 405, 406, 407, 408 the effect on the distribution is dependent upon the coupling coefficients between the target cell 400 and the neighbor cell 401, 402, 403, 404, 405, 406, 407, 408 and the distribution voltage shift during program operation of the neighbor cell 401, 402, 403, 404, 405, 406, 407, 408. FIG. 6 illustrates the coupling coefficient of the eight neighboring cells 401, 402, 403, 404, 405, 406, 407, 408 affecting the target cell 400.

Typically, cells in a page are sequentially programmed from the bottom to the top ($WL_{n-2}$ to $WL_{n+2}$). In this way, background pattern dependency is minimized. Additionally, cell-to-cell coupling effects are mitigated for the target cell 400, because lower cells (pages) are programmed before the target cells 400. However, this order of programming is true only if the target cell 400 is reprogrammed (or programmed) to "0". Alternatively, if the target cell 400 stays in the erased state, it will be affected by the lowest cells as well as the highest cells, because it is not possible to lower the threshold voltage during program operation. Only the erase operation of the cells can lower the threshold voltage. As such, for an erased cell, the effect of all the surrounding cells must be considered.

The coupling coefficients of the cells do not all have the same values/weights. Experimental results show that Y coefficients 402, 407 are dominant, followed by X 404, 405 then XY 401, 403, 406, 408. Bit errors introduced by the coupling coefficients (and other phenomena) can be corrected using an ECC such as LDPC coding.

LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired. Well-designed LDPC codes have an UBER very near the Shannon limit.

Figure 7:
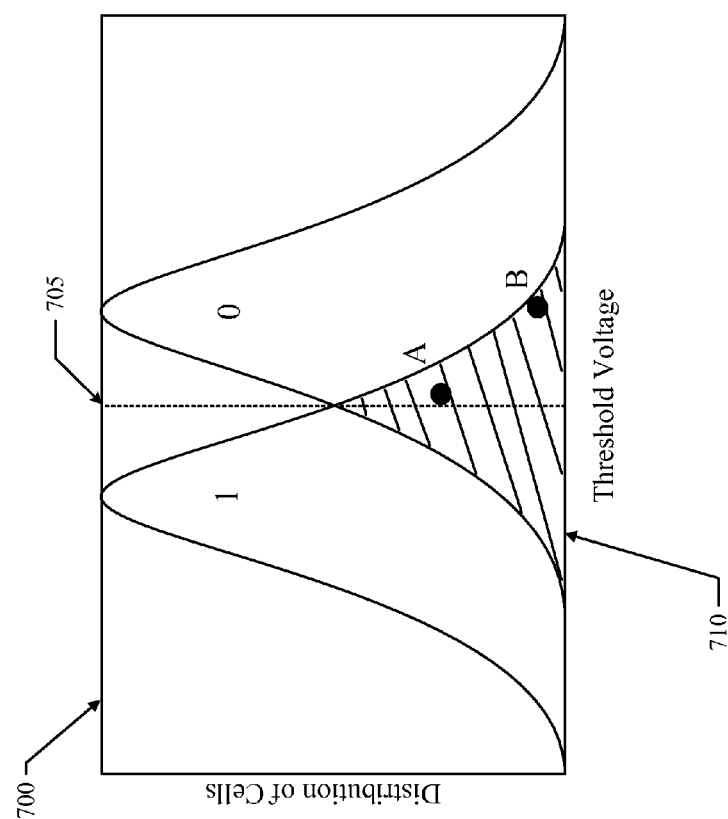
FIG. 7 is a graphical illustration of the distribution overlap in the two voltage distributions used for decoding.

The power of LDPC codes resides in the ability of the decoding strategy to exploit the soft information on the stored data. In LDPC decoding, the two voltage distributions represent the two possible states: "0" and "1", of the cells within the NAND chips. When the voltage distributions overlap 710, as shown with reference to the graph 700 of FIG. 7, errors arise. A hard decision decoder will read all the positive values as 0 and all the negative values as 1. So, in the situation depicted in the graph 700, the overlap region 710 will be composed of read errors. However, observing error points A and B within the overlap region 710, it is clear that the error points may vary in magnitude. For example, point A is slightly positive, while point B is farther away from the threshold voltage 705. As such, point A is more likely to be in error than point B. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. The sign of the LLR typically provides the bit estimation (i.e. positive LLR corresponds to 0 and negative LLR corresponds to 1). The magnitude of the LLR provides the reliability of the estimation (i.e. $|LLR|=0$ means that the estimation is completely unreliable and $|LLR|=\infty$ means that the estimation is completely reliable and the bit value is known). In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

To perform a successful read operation on the NAND-based flash memory device employing LDPC encoding, a plurality of read operations are performed at various read reference voltage levels, by applying the read reference voltage to the corresponding control gate of the cell to see if the sensed cell conducts at that particular read reference voltage. The responses of the cell for each of the read reference voltages are then used to determine the value of the bit stored by the cell. The conventional design practice is to employ uniform distribution for sensing the cells, wherein the soft-decision reference voltages are uniformly distributed between two consecutive hard-decision reference voltages. However, since the area where most errors will occur is in the overlap of the threshold voltage distributions, and since most of the overlap between two adjacent states occurs in the vicinity of the corresponding hard-decision reference voltages, the present invention employs non-uniform partitioning of the threshold voltage distribution to improve the quality of the soft information. As such, by concentrating the soft-decision reference voltages around the hard-decision reference voltages and within the overlap regions, the same number of sensing voltages can be used in a non-uniform way to provide better information for determining the bit value.

Figure 8:
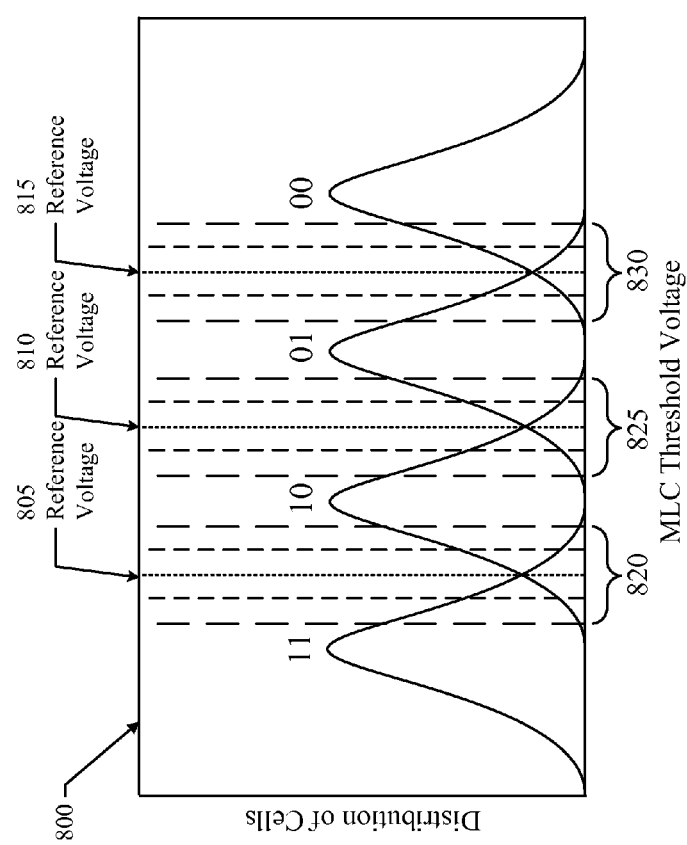
FIG. 8 is a graphical illustration of is a graphical illustration of a possible threshold voltage distribution for a multi-level cell and the corresponding read reference voltages.

As shown with reference to FIG. 8, in accordance with an embodiment of the present invention, non-uniform threshold voltage sensing is performed for an MLC cell, wherein the overlap regions 820, 825 and 830 are defined around each of the hard-decision reference voltages 805, 810 and 815 and uniform memory sensing is performed within each of the overlap regions using the plurality of soft-decision reference voltages. In the case of an MLC flash memory, the overlap regions of the threshold voltage distributions for the flash memory cells are divided into a number of partitions, on either side of the hard-decision reference voltage, by moving the read reference voltages. In order to locate each bit without error, more read operations at these soft-decision reference voltages are required. As shown in the graph 800 of FIG. 8, in a specific embodiment, each overlap region 820, 825 and 830 is divided into four partitions, so that each bit (LSB and MSB) is read utilizing 3 bits, where 3 represents the number of soft-decision bits.

As previously described, for LDPC decoding, the log likelihood ratio (LLR) of the received data bits in the codeword is used to decode the codeword. As such, after each bit position is measured and the 3-bit soft-decision data has been identified, the proper LLR associated with the soft-decision bits is extracted from a look-up table stored in the flash controller and the LLR is then fed to the LDPC decoder for subsequent decoding of the codeword. In the exemplary embodiment shown in FIG. 8, 3 soft-decision bits are used to identify eight regions, therefore eight LLRs will be extracted from the look-up table to perform the LDPC decoding process. Additionally, every overlap region requires an LLR look-up table, so that in the MLC case illustrated in FIG. 8, three LLR look-up tables are needed to provide the necessary decoding information.

In an alternative embodiment, a single soft-decision reference voltage may be used instead of a plurality of soft-decision references voltages, resulting in only one soft-decision bit with two states. In this embodiment, the soft-decision decoding may be considered hard-decision decoding resulting in a two-state result and therefore, two corresponding LLRs. As with the soft-decision LLRs, these hard-decision LLRs will also change over the lifetime of the device.

As previously described, due to neighboring cells and the program/erase wear-out of the flash memory, the bit error rate (BER) of the memory device increases during its lifetime. It follows that the log likelihood ratios (LLRs) of the flash memory device also change over the lifetime of the device, as the LLR values are measures of the reliability of the data read from the memory storage. However, LDPC decoders currently known in the art do not consider the changes in the LLRs associated with the flash memory during the lifetime of the device and the effects of the neighboring cells on a target cell of the device. Instead, prior art LDPC decoders are designed for a maximum bit error rate that does not change during the memory device lifetime and does not consider the effects of neighboring cells.

LLRs are a function of the shape and location of the threshold voltage distribution for the flash cells and can be computed or measured in a characterization laboratory. In order to provide the LDPC decoder with the correct soft-decision information, the LLR look-up tables used for decoding must represent the channel and the BER at that specific point in the lifetime of the flash memory. The threshold voltage distribution for the flash cells changes over the lifetime of the device due to wear-out and as such, the LLRs also change. As such, in order to provide the correct soft-decision information over the lifetime of the flash memory, a plurality of LLR tables are needed that accurately reflect the threshold voltage distributions at various points over the lifetime of the device. For example, a first LLR look-up table would be used for a fresh device, having a BER of around $10^{-6}$ and a second LLR look-up table would be used for the device towards the end of the device lifetime, when the BER is around $10^{-2}$. By utilizing LLR look-up tables that are reflective of the current point in the lifetime of the device, the LLR look-up table will most accurately represent the noise and the LDPC will perform in a quasi-optimal way.

Each flash technology exhibits a unique threshold voltage distribution over its lifetime. As such, a generic law does not exist for determining standard LLR look-up table values for the variety of flash devices available in the market. Instead, in order to characterize the flash device and thereby determine the appropriate lifetime LLR look-up table values, it is necessary to measure billions and billions of flash cell distributions over the lifetime of each flash device to understand how the flash cells will perform. The lifetime threshold voltage distribution will differ among technologies and among vendors. For example, it may be determined that a different LLR look-up table for every decade of BER accurately reflects the behavior of the flash cells over the lifetime of the device. As such, when the BER of the flash device changes from $10^{-4}$ to $10^{-5}$, a different LLR look-up table will be accessed in the flash controller to reflect this characterized change in BER. Additionally, at any single point in time, there may be multiple flash chips of the flash device operating at different points in their lifetime, or perhaps a single flash chip comprising regions that are operating at different points in their lifetime. By performing characterization of the flash device, either by computational techniques and laboratory measurements, a plurality of lifetime LLR look-up tables can be generated for the flash device that accurately reflect the change in the threshold voltage distribution of the flash device over its lifetime. The LLR look-up tables may also reflect changes to specific flash chips of the flash device or specific regions of a flash chip over the lifetime of the device. The plurality of LLR look-up tables are stored in the flash memory controller and in operation, the flash memory controller selects the appropriate LLR look-up table to use for decoding the codeword based upon the present point in the lifetime of the device.

Additionally, in order to provide a higher quality LLR for a target cell, the effect of the programmed states of the neighboring cells on the threshold voltage of the target cell need to be considered.

In the present invention to address the contribution of the programmed state of the neighboring cells to the threshold voltage of a target cell, a neighboring cell contribution LLR look-up table is populated that is representative of the BER of a target cell (bit error probability) for each combination of possible patterns of the surrounding cells. With reference to FIG. 6, for each target cell 400, $2^9=512$ combinations of 0/1 are possible in considering all of the 9 cells 401, 402, 403, 404, 405, 406, 407 and 408 surrounding the target cell 400.

Figure 9:
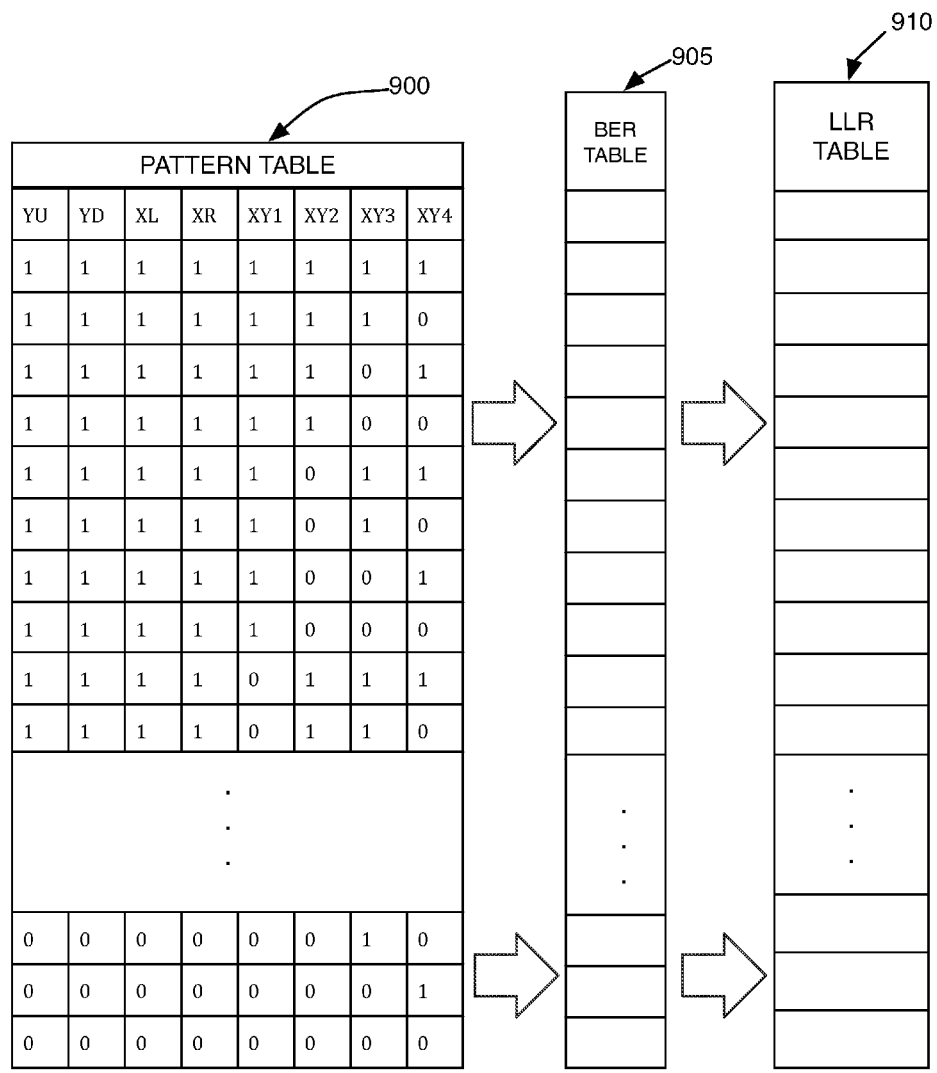
FIG. 9 is an illustration of a pattern table, BER table and LLR table in accordance with an embodiment of the present invention.
Figure 10:
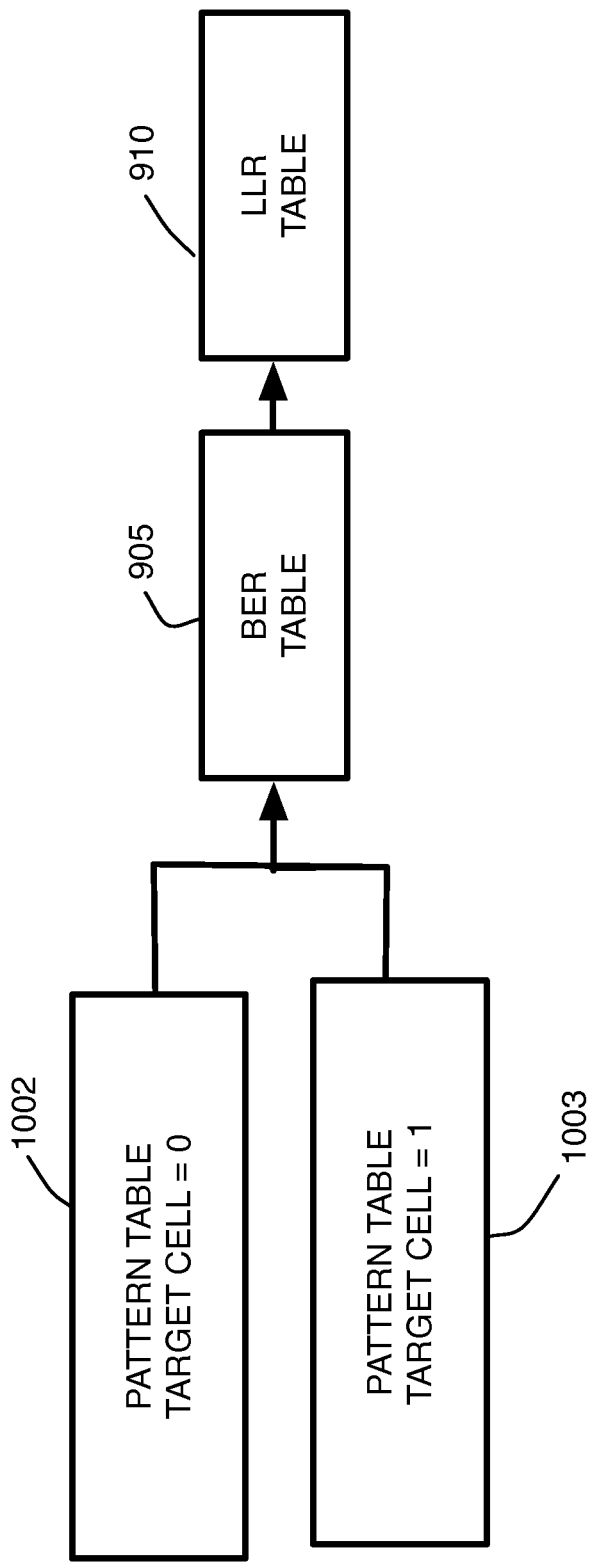
FIG. 10 is an illustration of a pattern table, BER table and LLR table in accordance with an embodiment of the present invention.

FIG. 9 illustrates a pattern table 900 for the neighboring cells 401, 402, 403, 404, 405, 406, 407 and 408 surrounding the target cell 400, a BER table 905 for the target cell 400 and a resulting neighboring cell contribution LLR look-up table 910 populated by the BER table and the pattern table. In accordance with the present invention, the pattern table 900 in FIG. 9 includes all of the $2^8=256$ pattern combinations for the 8 surrounding cells 401, 402, 403, 404, 405, 406, 407 and 408. Additionally, there is one pattern table 1003 for the case in which the target cell 400 is programmed to "1" and another pattern table 1002 for the case in which the target cell 400 is programmed to "0", as shown with reference to FIG. 10. The BER table 905 is then populated as a function of the pattern 0/1 in the surrounding cell as:

$$BER = f(yu, yd, xl, xr, xyl, xy2, xy3, xy4)$$

In addition, it is possible that the values of all neighboring cells 401, 402, 403, 404, 405, 406, 407 and 408 may not need to be fully determined for the application of the invention. For example, in the case of an MLC, the two states of the MSB value may have a larger voltage difference than the two LSB states. So, the MSB bit of the neighboring cells may influence the target cell 400 the most and the LSB bit of the neighboring cells may be ignored.

Figure 11:
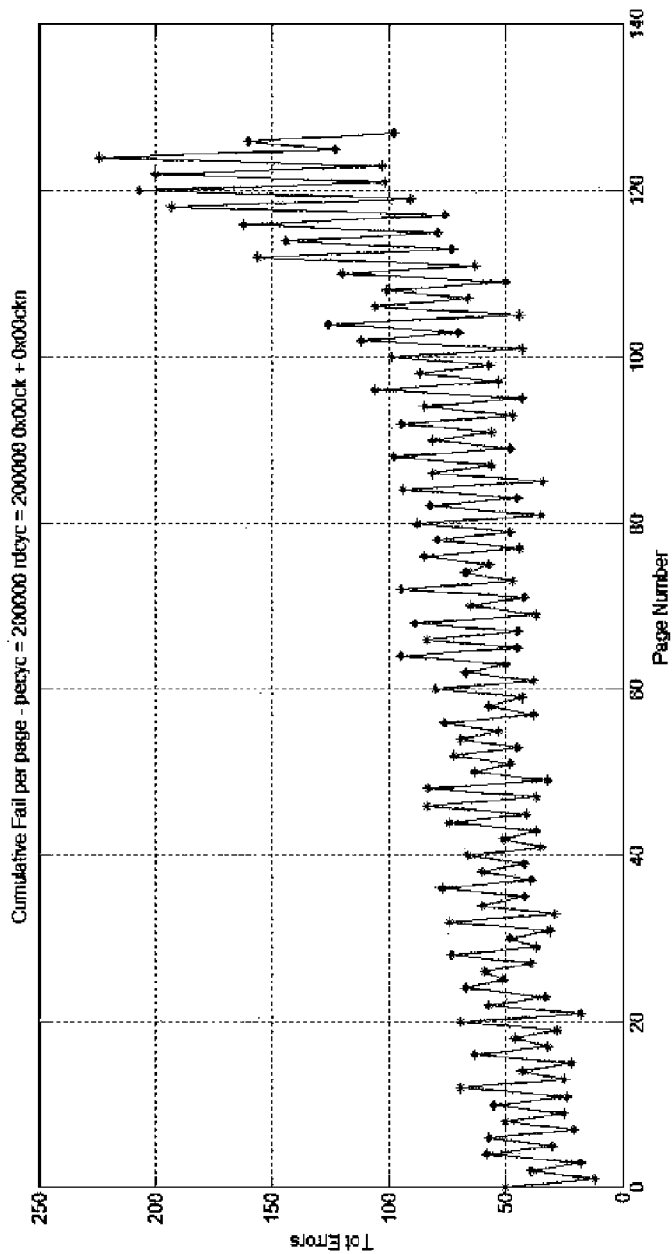
FIG. 11 is a graphical illustration of the average fail distribution inside pages of a NAND device.

Experimental results show that the BER of the target cell 400 is page dependent. As such, a BER table 905 can be populated for each page. FIG. 11 illustrates a typical fail distribution as a function of page number (x-axis). As shown, fails are not uniformly distributed among pages, but instead, the number of fails has a tendency to increase with page number. It follows that different BER tables 905 can be populated, page by page. Experimental results show that two BER tables 905 are sufficient for an interleaving architecture of the NAND device, wherein, one BER table 905 is representative of the even pages and another BER table 905 is representative of the odd pages. Additionally, each intermediate combination can be included, wherein one BER table 905 is representative of the lower pages and another BER table 905 is representative of the higher, etc. Various other configurations of the BER table 905 appropriate for the particular NAND device are within the scope of the invention.

The entries for the BER table 905 can be measured by the NAND controller is many ways. For example, BER can be measured on one, or more, dummy blocks during the device life. Since BER is dependent upon the number of P/E cycles, it must be measured for every fixed or variable step of P/E cycles. BER can also be measured on the data block, similar to the dummy block. The BER can be measured every fixed or variable step of P/E cycles after the erase cycle.

After the neighboring cell contribution LLR look-up tables have been populated and stored in the nonvolatile memory storage module, the nonvolatile memory controller of the present invention can be used to provide one or more log likelihood ratios (LLRs) of a target cell for LDPC decoding. Accessing an LLR look-up table comprising LLRs that reflect the contribution of the neighboring cells to the threshold level of the target cell being read, as taught by the present invention, may be used to improve the performance of the LDPC decoder in decoding LDPC encoded data that is stored in a nonvolatile memory system. As shown with reference to FIG. 12, a nonvolatile memory system 1200, such as a solid state drive, includes a nonvolatile memory controller 1205 coupled to a nonvolatile memory storage module 1215 comprising a plurality of NAND chips 1230. In this embodiment, the NAND chips 1230 store the encoded codewords and the memory controller 1205 is designed to execute reading and writing controls for the NAND chips 1230 according to reading and writing instructions received from an access device. The nonvolatile memory controller 1205 further includes read circuitry 1240 configured for reading a threshold voltage of a target cell stored in the nonvolatile memory storage module 1215 and for reading a threshold voltage of one or more neighboring cells of the target cell stored in the nonvolatile memory storage module 1215. The nonvolatile memory controller further includes one or more neighboring cell contribution LLR look-up tables 1235 associated with the nonvolatile memory storage module 1215. Look-up circuitry 1250 of the nonvolatile memory controller 1205 is configured for extracting an LLR associated with the threshold voltage of the target cell and the threshold voltage of the one or more neighboring cells from the one or more neighboring cell contribution LLR look-up tables 1235 and for providing the extracted LLR to an LDPC decoder.

The read circuitry 1240 is further configured for reading a logical page of the nonvolatile memory storage module 1215, where the logical page includes the target cell. The read circuitry 1240 is further configured for reading one or more neighboring logical pages of the nonvolatile memory storage 1215, each of the one or more neighboring logical pages including one of the neighboring cells of the target cell. In reading the threshold voltage of the target cell, the read circuitry 1240 may utilize a plurality of soft-decision reference voltages to read a plurality of threshold voltages of the target cell. Additionally, in reading the threshold voltages of the one or more neighboring cells, the read circuitry 1240 may utilize a plurality of soft-decision reference voltages to read a plurality of threshold voltages of each of the one or more neighboring cells.

In one embodiment, the one or more neighboring cell contribution LLR look-up tables 1235 may include a neighboring cell contribution LLR look-up table 1235 that is associated with a current point in the lifetime of the nonvolatile memory storage module 1215. As such, the BER appropriate for the age of the nonvolatile memory storage module 1215 may be taken into consideration when generating the neighboring cell contribution LLR look-up tables 1235.

In an additional embodiment, the one or more neighboring cell contribution LLR look-up tables 1235 may include a neighboring cell contribution LLR look-up table 1235 that is associated with a logical page of the nonvolatile memory storage module 1215 that includes the target cell. As such, the BER that is appropriate for the logical page of the nonvolatile memory storage module 1215 may be taken into consideration when generating the neighboring cell contribution LLR look-up tables 1235.

Because the contribution from the neighboring cells is dependent upon the programmed state of the target cell, one or more neighboring cell contribution LLR look-up tables 1235 may include a first neighboring cell contribution look-up table associated with a programmed state of the target cell and a second neighboring cell contribution look-up table associated with an unprogrammed state of the target cell, wherein the first neighboring cell contribution look-up table 1235 is different than the second neighboring cell contribution look-up table 1235.

Figure 12:
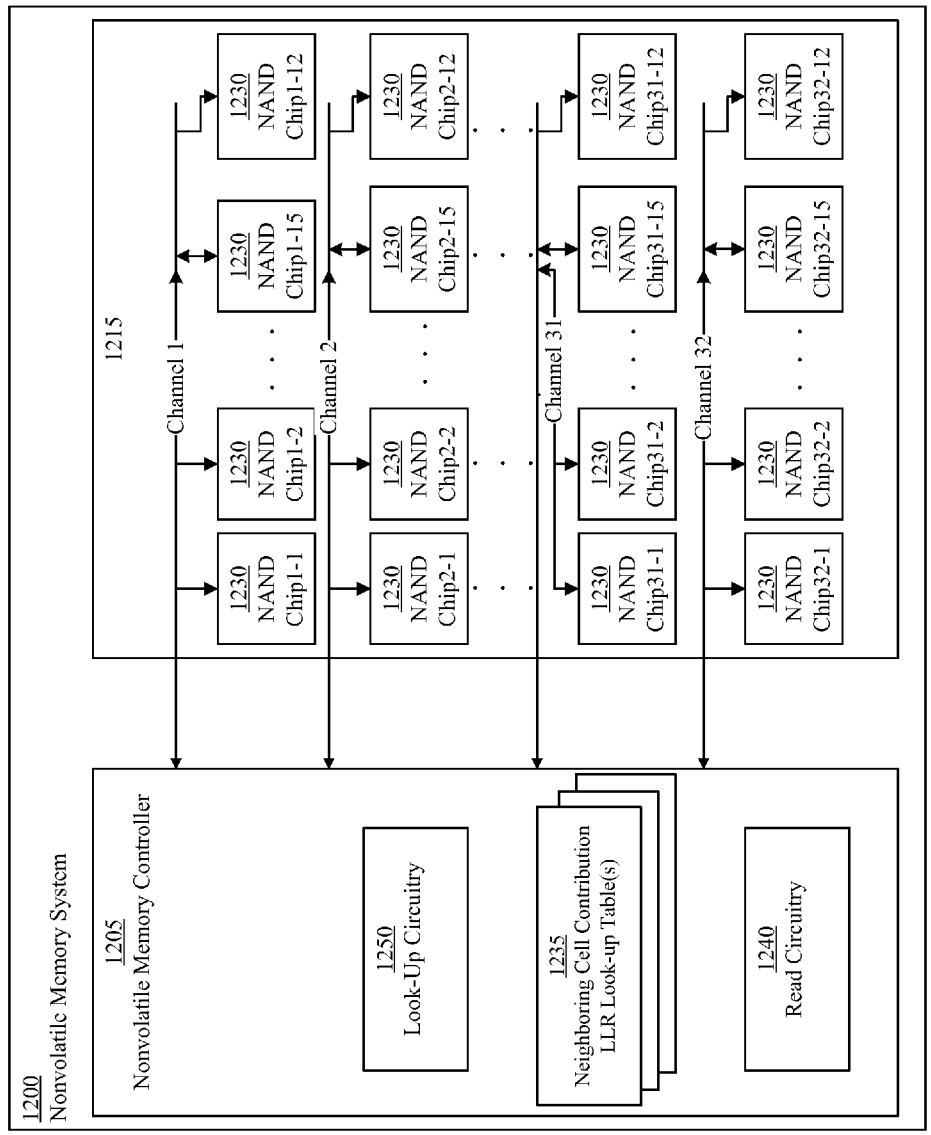
FIG. 12 is a block diagram illustrating a nonvolatile memory system in accordance with an embodiment of the present invention.
Figure 13:
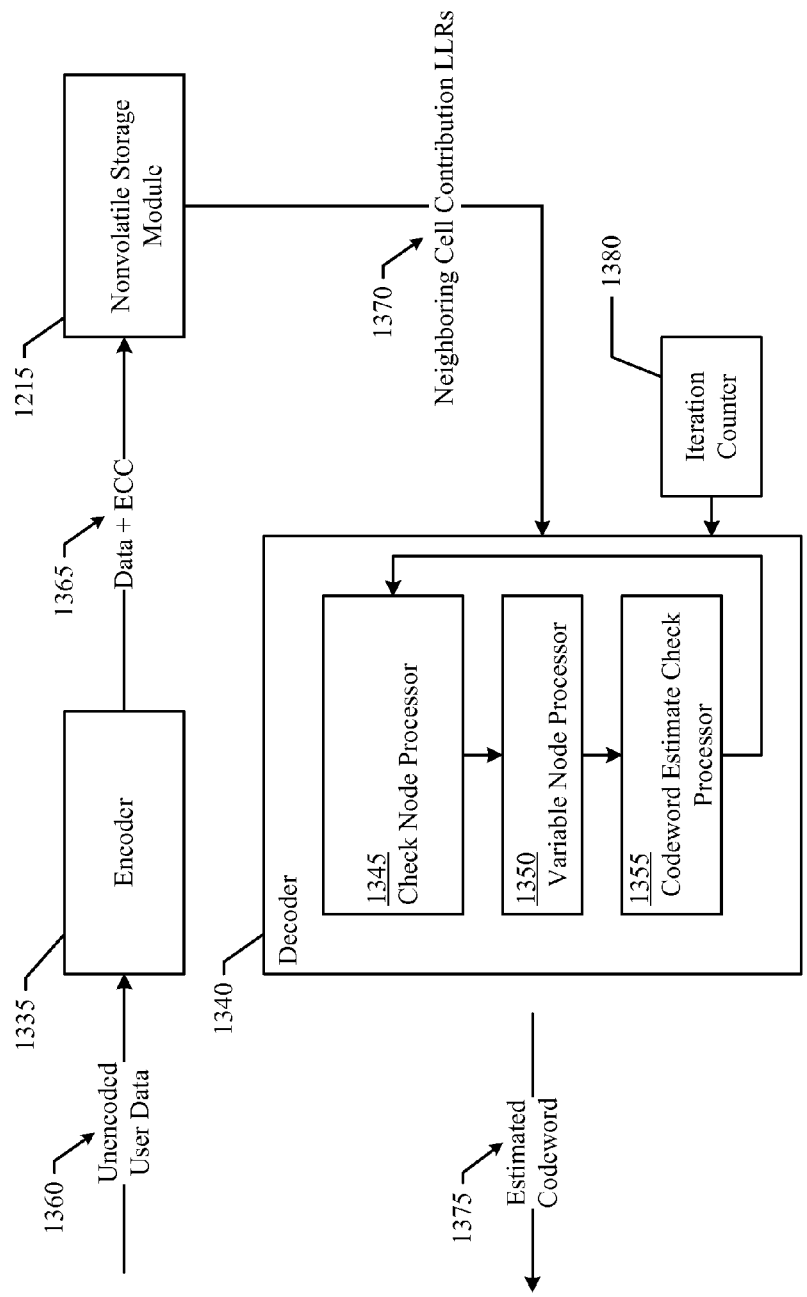
FIG. 13 is a block diagram illustrating LDPC encoding and LDPC decoding in accordance with an embodiment of the present invention.

The nonvolatile memory storage module 1215 of FIG. 12 may be incorporated into a LDPC system as shown with reference to FIG. 13. As shown, the LDPC system may comprise an encoder 1335 that is responsible for adding the parity bits to the unencoded user data 1360 in accordance with a low-density parity check (LDPC) code. The LDPC encoded data 1365, which includes the unencoded user data 1360 and an error correction code, may then be stored as encoded codewords in the nonvolatile memory storage module 1215. In a particular embodiment, the nonvolatile memory storage module 1215 may include a plurality of NAND chips 1230. The nonvolatile memory storage module 1215 and a nonvolatile memory controller 1205 having a plurality of neighboring cell contribution look-up tables 1235 may be integrated into a nonvolatile memory system 1200 as previously described with reference to FIG. 12.

In operation of the present invention, during a read operation of the nonvolatile memory storage module 1215, multiple reads of the stored codewords are executed to provide soft-decision information in conjunction with the neighboring cell contribution LLRs 1370 extracted from an LLR look-up table 1235 that is specific to the neighboring cells of the device. The LLR look-up tables 1235 may also include the current point in the lifetime of the device, which may be identified by the BER of the device or by other means, such as by counting the P/E cycles of the device. The LLRs 1370 are used as input to the LDPC decoder 1340 to decode the user message data 1360 encoded by the encoder 1335, utilizing LDPC coding parity check matrix (H). The received LLR values for each variable node are taken as the initial variable node messages. The check node processor 1345 updates the check nodes of a first layer with the variable node messages to which they are connected. The resulting messages of the check node processor 1345 are then passed to the variable node processor 1350 and the variable node processor 1350 then updates each variable node with the check node messages to which they are connected. The iterative decoding process continues, as is known in the art, and the resulting codeword estimate is then checked by a codeword estimate check processor 1355, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is determined to be a valid codeword, the decoding is complete and the estimated codeword is provided as output 1375 from the decoder 1340. If it is determined by the codeword estimate check processor 1355 that the codeword estimate is not a valid codeword, a second iteration of the decoding begins. The iteration counter 1380 may be used to track the number of iterations of the decoding process and may cause the decoding to terminate if a maximum number of iterations is reached.

In order to determine the LLRs it is necessary to know the states of the cells surrounding the target cell so that the pattern can be determined and the appropriate LLR can be extracted from the neighboring cell contribution LLR look-up table 1235. The nonvolatile memory storage module

1215 comprises a plurality of pages which may be organized in an interleaved architecture or, alternatively, in an all-bit-line (ABL) architecture.

Figure 14:
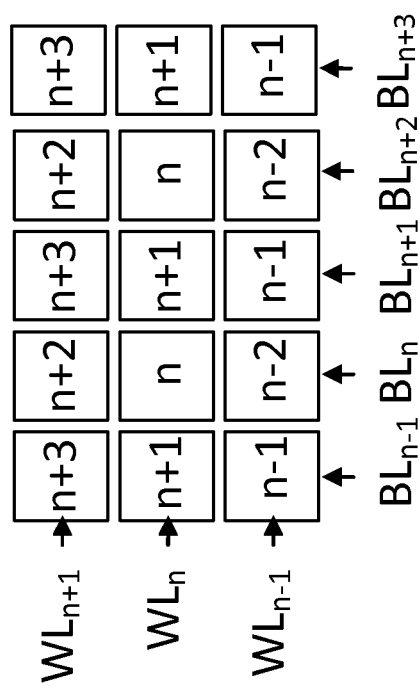
FIG. 14 is an illustration of the page organization for an interleaving architecture in a NAND device.

In an exemplary embodiment, in the case of an interleaving NAND memory architecture, two pages belong to the same word-line (WL). As shown with reference to FIG. 14, to measure the pattern of the surrounding cells of a target cell on page n, requires the reading of pages: n+3, n+2, n+1, n, n−1, n−2. In a random read case, these six pages need to be read in order to be able to correct page "n". An additional advantage can be realized when utilizing a sequential read access for the interleaved NAND memory architecture. While there is still a latency associated with the six pages read in a sequential read, five of the six pages needed to correct page "n" can also be used to correct page "n+1". As such, in a sequential read access, a latency of six reads exists, but there is no associated overhead, i.e. 2 pages read in order to correct 2 pages, or 1 read/page.

Figure 15:
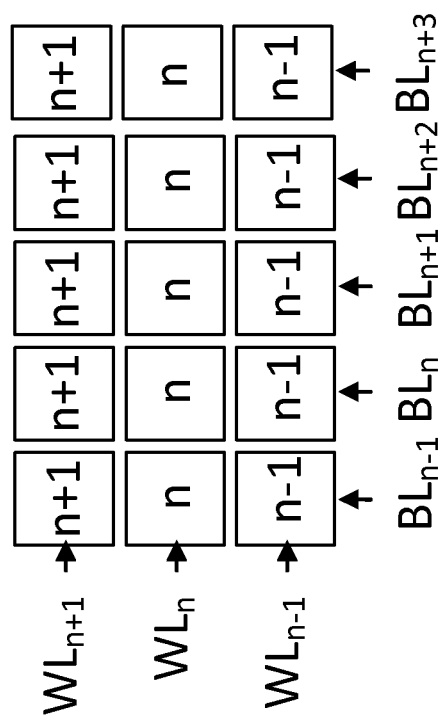
FIG. 15 is an illustration of the page organization for an all bit-line architecture in a NAND device.

In an additional embodiment, as shown with reference to FIG. 15, in the case of an all bit-line architecture, to measure the pattern of the surrounding cells of a target cell on page n, requires the reading of pages: n−1, n, n+1. In a random read case, these three pages must be read in order to be able to correct page "n". An additional advantage can be realized when utilizing a sequential read access. While there is still a latency associated with the three pages read in a sequential read, once page "n" in corrected, it is only necessary to read page "n+2" in order to be able to correct page "n+1". As such, in all bit-line sequential read access, a latency of 3 reads exists, but there is no associated overhead: 1 page read in order to correct 1 page, or 1 read/page The plurality of LLR look-up tables reflecting the effects of the neighboring cells are stored in the flash memory controller and in operation, the flash memory controller selects the appropriate LLR look-up table to use for decoding the codeword.

In the present invention, an LLR look-up table need not be a physical entity, but may be considered in a broader sense to be a logical entity. Additionally, the various LLR look-up tables reflecting the current BER of the device may be independent look-up tables or may alternatively be subsets of a larger look-up table.

The present invention utilizes a pattern recognition circuit to identify a pattern of the state of some or all of the neighboring cells in addition to the value of a target cell. The interpretation of the pattern by the pattern recognition circuit takes into account the proximity of the neighboring cells to the target cell, electrical coupling strengths, etc. The pattern recognition circuit translates the pattern into an LLR value for storage into an LLR table. Many different patterns may translate to the same LLR value. A particular pattern for one vendor's flash technology may translate into a different LLR on another vendor's flash technology because the same pattern may be representing a different physical layout of the cells. Furthermore, the LLR a certain pattern translates to may change over time as a result of the program/erase cycles.

For example, pattern A may translate to LLR "x" at the beginning of the life of the flash device, but after 8,000 erase cycles, pattern A may now translate to LLR "y". The LLRs stored in the look-up tables may reflect both the contribution of the neighboring cells to a cell being read and the change of the contribution over the device lifetime.

Additionally, it is not necessary to consider all of the neighboring cells in the LLRs. For example, the diagonal neighbors may have a weaker electrical coupling with the center cell and may be omitted. While the final LLR value for the center cell may not be quite as accurate as it could be when considering all the neighboring cells, omitting the diagonal neighbors may save additional flash read and processing time. The tradeoff in increased performance by omitting some of the neighboring cells may be preferred in a particular application.

Figure 16:
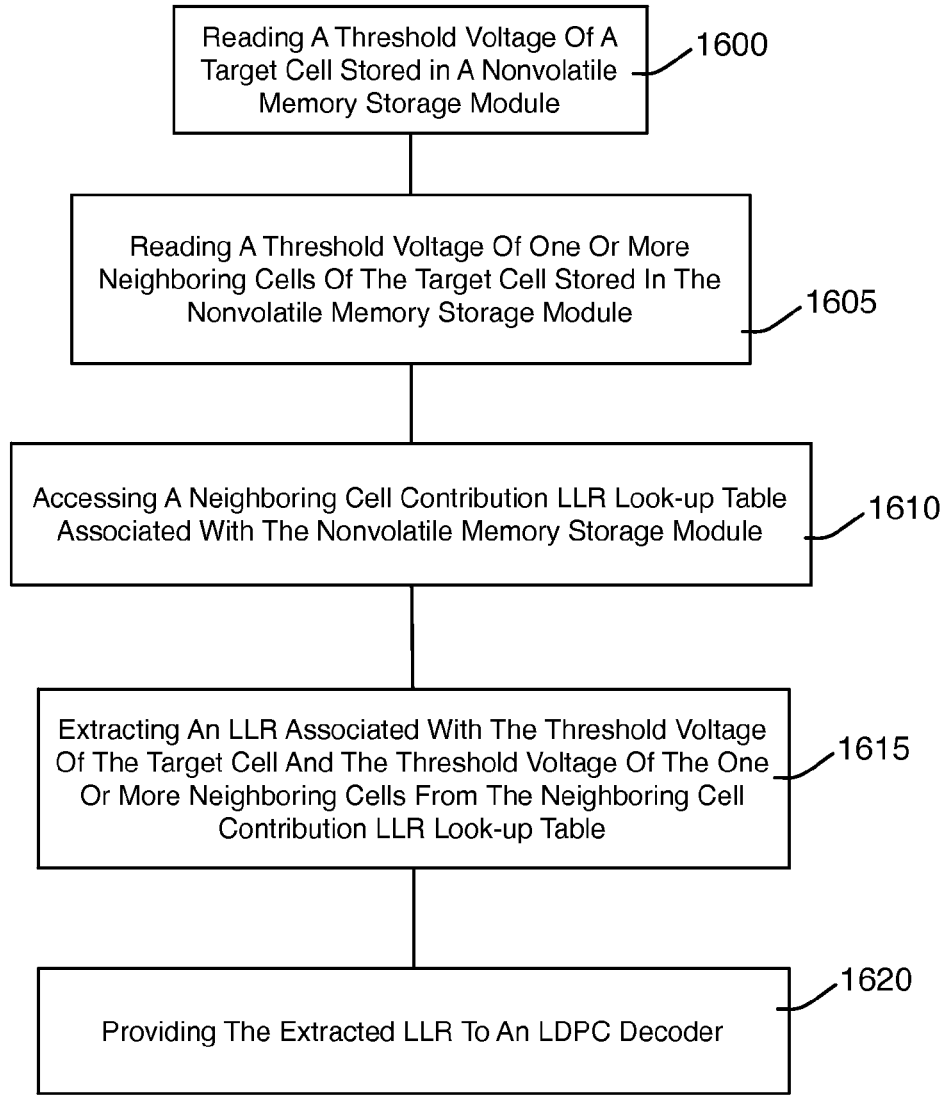
FIG. 16 is a flow diagram illustrating a method of providing LLRs to an LDPC decoder in accordance with an embodiment of the present invention.

With reference to FIG. 16, a method of providing one or more log likelihood ratio (LLRs) of a target cell to a low-density parity check (LDPC) decoder is described. The method begins by reading a threshold voltage of a target cell stored in a nonvolatile memory storage module 1600. In one embodiment, the threshold voltage of the target cell may be read from a nonvolatile memory storage module 1215 using the read circuitry 1240 of the nonvolatile memory controller 1205. The nonvolatile memory storage module 1215 may include a plurality of pages organized in an interleaved architecture or in an all-bit-line (ABL) architecture. In reading a threshold voltage of a target cell stored in a nonvolatile memory storage module 1600, the method may further include, reading the threshold voltages of a logical page of cells of the nonvolatile memory storage module, wherein the logical page of cells includes the target cell. Reading a threshold voltage of a target cell stored in a nonvolatile memory storage module 1600 may further include, using a plurality of soft-decision reference voltages to read a plurality of threshold voltages of the target cell.

After reading a threshold voltage of a target cell stored in a nonvolatile memory storage module 1600, the method further includes, reading a threshold voltage of one or more neighboring cells of the target cell stored in the nonvolatile memory storage module 1605. In one embodiment, the threshold voltage of the one or more neighboring cells may be read from a nonvolatile memory storage module 1215 using the read circuitry 1240 of the nonvolatile memory controller 1205. Reading a threshold voltage of one or more neighboring cells of the target cell stored in the nonvolatile memory storage module 1605 may further include, reading the threshold voltages of one or more logical pages of cells of the nonvolatile memory storage module, each of the one or more logical pages including one of the neighboring cells.

After the threshold voltage of the target cell and the threshold voltage of the one or more neighboring cells of the target cell have been read, the method further includes, accessing a neighboring cell contribution LLR look-up table associated with the nonvolatile memory storage module 1610. In one embodiment the neighboring cell contribution LLR look-up table 1235 may be stored in a nonvolatile memory controller 1205. Accessing a neighboring cell contribution LLR look-up table associated with the nonvolatile memory storage module 1610 may further include, accessing a neighboring cell contribution LLR look-up table associated with a current point in the lifetime of the nonvolatile memory storage module. Additionally, accessing a neighboring cell contribution LLR look-up table associated with the nonvolatile memory storage module 1610 may further include, accessing a neighboring cell contribution LLR look-up table associated with a logical page of the nonvolatile memory storage module that includes the target cell. In an additional embodiment, accessing a neighboring cell contribution LLR look-up table associated with the nonvolatile memory storage module 1610 may further include, accessing a first neighboring cell contribution look-up table when the threshold voltage of the target cell indicates a programmed state of the target cell and accessing a second neighboring cell contribution look-up table when the threshold voltage of the target cell indicates an unprogrammed state of the target cell, wherein the first neighboring cell contribution look-up table is different than the second neighboring cell contribution look-up table.

Upon accessing the neighboring cell contribution LLR look-up table associated with the nonvolatile memory storage module 1610, the method further includes extracting an LLR associated with the threshold voltage of the target cell and the threshold voltage of the one or more neighboring cells from the neighboring cell contribution LLR look-up table 1615.

After the appropriate LLR has been extracted from the neighboring cell contribution LLR look-up table 1615, the extracted LLR is provided to an LDPC decoder 1620.

The present invention utilizes the knowledge of now the NAND cells are physically laid out and their program/erase and read cycles to predict the most likely correct state of a cell whose correct state has been corrupted with noise. With the information regarding the programmed states of the neighboring cells, the physical proximity of the neighboring cells and the number of read and program/erase cycles that have been performed on a cell being read, it can be determined how the current state of a neighboring cell influences the state of the cell. If these factors have a very small effect, the LLR value assigned to the cell being read would be a large magnitude. If these factors have a larger effect, the assigned LLR value would have a smaller magnitude, thereby indicating a decreased likelihood that the correct state of the cell is the value that was written. So, by reading the state of the neighboring cells, in addition to reading the target cell at a plurality of different voltage levels, and using a LLR corresponding to the soft information and the state of the neighboring cells, a high quality LLR is assigned to the cell being read, thereby improving the decode performance resulting in a faster convergence or enabling a previously unavailable solution. The higher quality LLR values of the present invention increase the likelihood of determining a correct codeword during the decode process.

Figure 17:
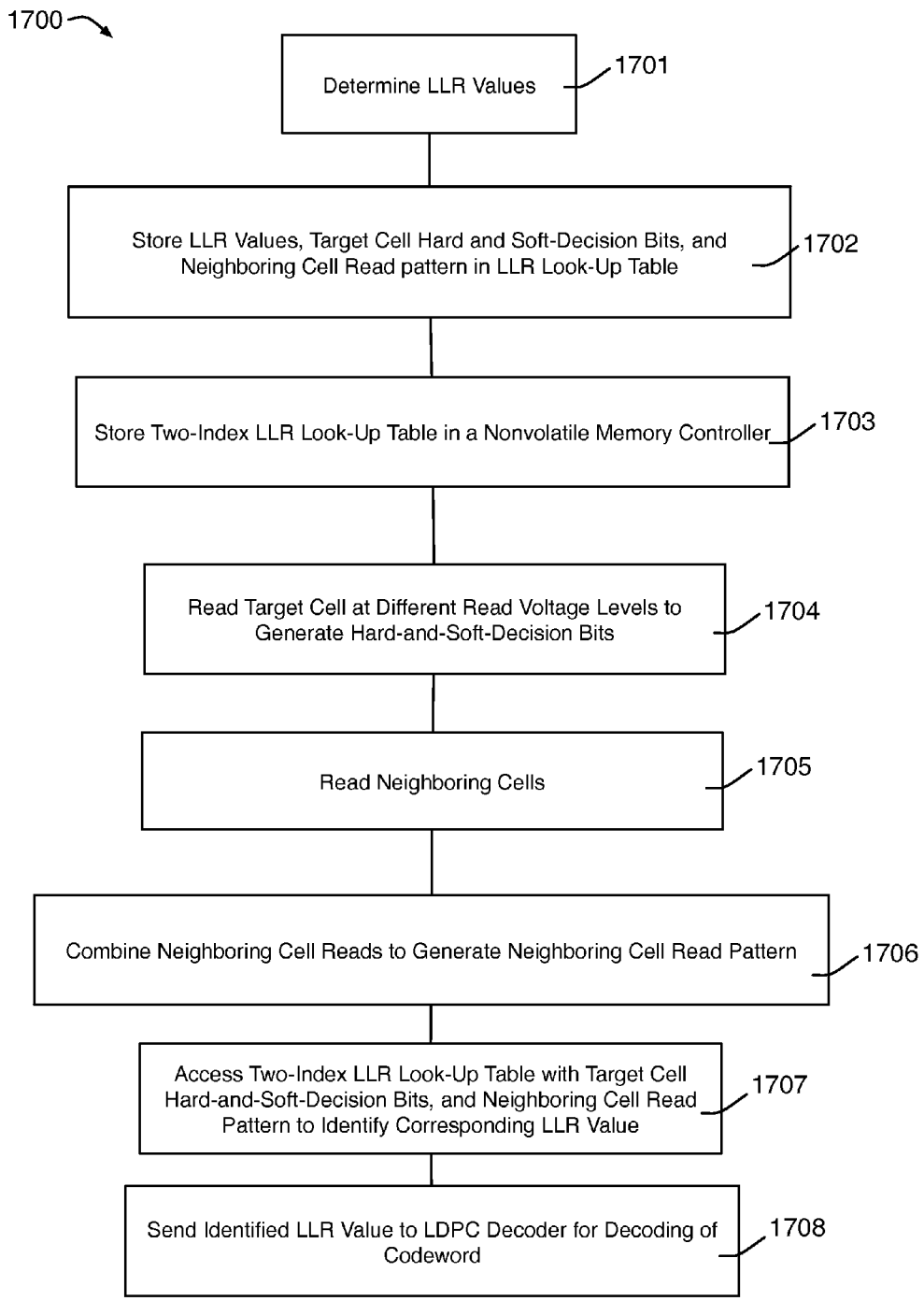
FIG. 17 is a flow diagram illustrating a method of providing LLRs to an LDPC decoder using a two-index LLR look-up table in accordance with an embodiment of the present invention.

FIG. 17 illustrates a method 1700 for determining LLR values for use in LDPC decoding in accordance with an embodiment of the present invention. As shown by step 1701, LLR values are determined. In the present embodiment LLR values are determined for each possible pattern of reads of a test memory cell and memory cells that adjoin the test memory cell, where the test memory cell is read at plurality of different voltage levels. Step 1701 can be performed in a test lab by coupling a test NAND memory device to a testing device and performing numerous reads of one or more test memory cells at varying test parameters. In the present embodiment, the test voltages divide the voltage threshold into a plurality of regions, and each region will have a plurality of corresponding LLRs associated with that region, each LLR associated with a pattern of reads of the target cell and neighboring cells.

In one exemplary embodiment shown in FIG. 20 the reads of step 1701 produce three information bits 2020 that can be referred to jointly as "hard-and-soft-decision bits," that identify a particular region of the voltage distribution associated with a bit stored in the test memory cell. The first bit, commonly referred to as a hard decision bit identifies regions on opposite sides of the hard-decision reference voltage 2001, the second bit, that can be referred to as a soft decision most significant bit identifies regions on opposite sides of soft-decision reference voltages 2002 and 2006, the third bit, that can be referred to as a soft decision least significant bit identifies regions on opposite sides of soft-decision reference voltages 2003 and 2005, and on opposite sides of soft-decision reference voltages 2004 and 2007.

Hard-decision reference voltage level 2001 and soft-decision reference voltages 2002-2007 divide the voltage distribution into eight regions, the hard-and-soft-decision bits 2020 uniquely identifying each of the eight regions. The regions include a region associated with an unprogrammed bit 2010 that can be, for example, a "1" and that can be identified by hard-and-soft-decision bits "111," a region that extends between threshold voltages 2004 and 2002 that can be identified by hard-and-soft-decision bits "110," a region that extends between threshold voltage 2002 and 2003 that can be identified by hard-and-soft-decision bits "100," a region that extends between threshold voltages 2003 and 2001 that can be identified by hard-and-soft-decision bits "101," a region that extends between threshold voltages 2001 and 2005 that can be identified by hard-and-soft-decision bits "001," a region that extends between threshold voltages 2005 and 2006 that can be identified by hard-and-soft-decision bits "000," a region that extends between threshold voltages 2006 and 2007 that can be identified by hard-and-soft-decision bits "010," and a region associated with a programmed bit 2011, that can be, for example, a "0" and that can be identified by hard-and-soft-decision bits "011."

Referring to step 1702, each determined LLR value, the target cell hard-and-soft-decision bits associated with the determined LLR value and the neighboring cell read pattern associated with the determined LLR value are stored in one or more look-up table. For example, the one or more look-up table can be stored in the memory of the testing device.

In the present embodiment the look-up table is a two-index LLR look-up table that includes a first index that identifies the region of the voltage distribution and a second index that identifies a neighboring cell pattern. Both the first index and the second index are required to identify the corresponding LLR value.

Figure 19:
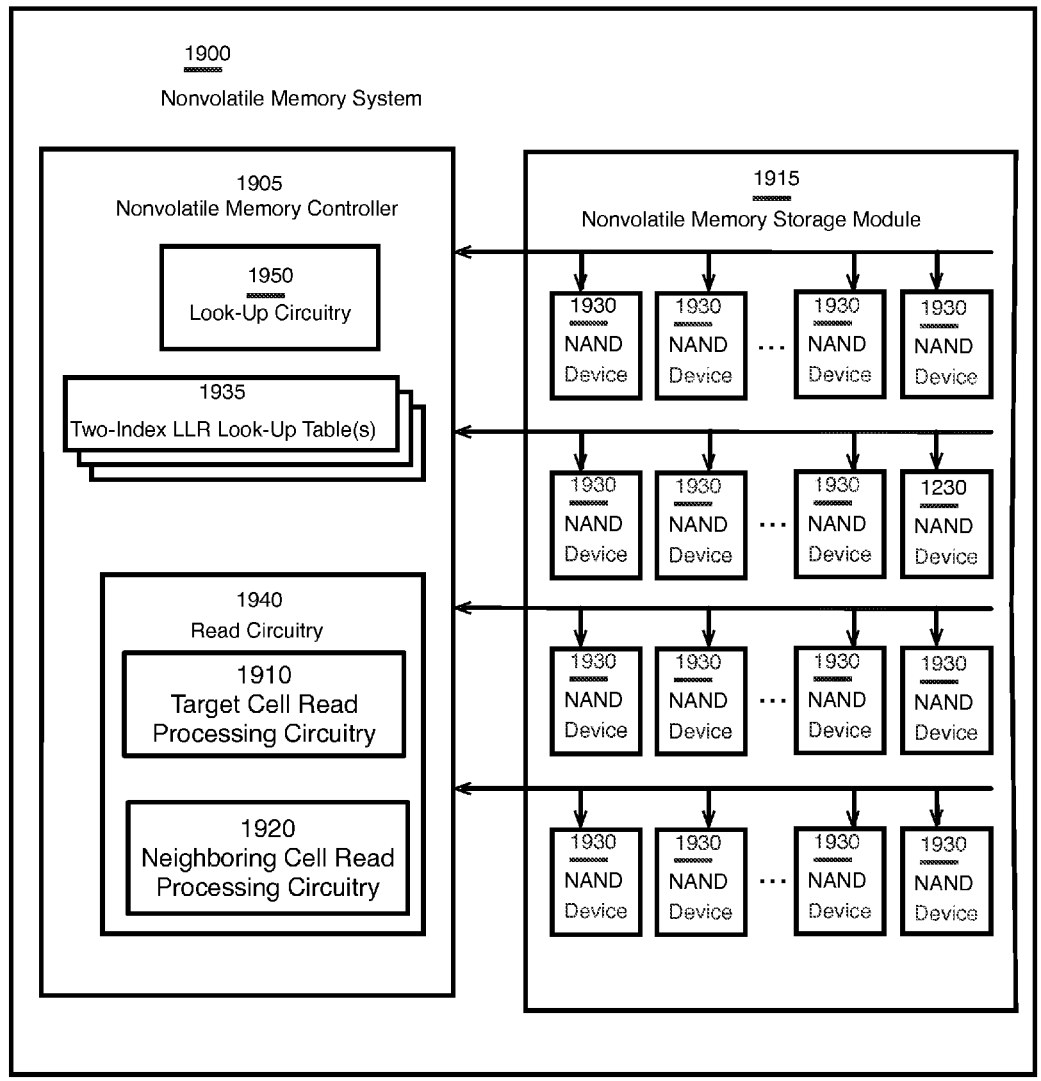
FIG. 19 is a block diagram illustrating a nonvolatile memory system in accordance with an embodiment of the present invention.

As shown by step 1703 the method includes storing one or more look-up table in a memory controller, the one or more look-up table including a LLR, the hard-and-soft-decision bits associated with the LLR and the neighboring cell read pattern associated with the LLR. In the embodiment of FIG. 19, a nonvolatile memory controller 1905 is shown that includes memory storage configured to store one or more two-index LLR look-up tables 1935 that can have the format of two-index LLR look-up table 1800 of FIG. 18. Nonvolatile memory controller 1905 also includes read circuitry 1940 that is coupled to Look-up circuitry 1950. Look-up circuitry 1950 is also coupled to target cell read processing circuitry 1910 and to neighboring cell read processing circuitry 1920.

Referring now to FIGS. 13 and 19, nonvolatile memory controller 1905 includes LDPC encoder 1335 that is configured to generate a codeword by encoding unencoded user data using an LDPC code. The codeword (data+ECC) 1365 is stored in one or more NAND devices 1930 that can be NAND semiconductor die coupled together to form non-volatile memory storage module 1915. The LDPC encoder 1335 and LDPC decoder 1340 shown in FIG. 13 operate in the same manner as previously described in FIGS. 1-16, except that, in the present embodiment, the LLRs provided to decoder 1340 are LLRs from two-index LLR look-up table stored in step 1703.

In the embodiment shown in FIG. 18, an exemplary two-index LLR look-up table 1800 is shown that includes the LLR values 1803 determined in step 1701 and stored in a memory controller in step 1703. Each LLR value 1803, the target cell hard-and-soft-decision bits 1801 associated with the LLR value 1803 and the neighboring cell read pattern

1802 associated with the LLR value 1803 are stored in a row of two-index LLR look-up table 1800. In the present embodiment two-index LLR look-up table 1800 includes a LLR, the hard-and-soft-decision bits associate with the LLR and the neighboring cell read pattern associated with the LLR for all possible combinations of target cell hard-and-soft-decision bits and neighboring cell read patterns, with each possible combination stored in a row of two-index LLR look-up table 1800. For example, the first row includes a first LLR, shown as LLR, that can be determined by testing a memory cell having a first voltage threshold that can be indicated by TARGET CELL HARD-AND-SOFT-DECISION BITS$_1$ and having a first neighboring cell read pattern that can be indicated by NEIGHBORING CELL READ PATTERN$_1$. The second row includes a second LLR, shown as LLR$_2$ that can be determined by testing a cell having a second voltage threshold indicated by TARGET CELL HARD-AND-SOFT-DECISION BITS$_2$ and having a second neighboring cell read pattern (NEIGHBORING CELL READ PATTERN$_2$), where one of TARGET CELL HARD-AND-SOFT-DECISION BITS$_2$ and NEIGHBORING CELL READ PATTERN$_2$ is different from TARGET CELL HARD-AND-SOFT-DECISION BITS$_1$ and NEIGHBORING CELL READ PATTERN$_1$. In an embodiment in which there are three soft-read bits, there will be $2^{11}$ possible combinations, giving a total of 2048 rows.

FIG. 21 illustrates an embodiment in which target cell hard-and-soft-decision bits 1801 of two-index LLR look-up table 1800 include target cell hard decision bit (X) that is read at a hard-decision voltage level, soft-read most significant bit (XMSB) and soft read least significant bit (XLSB) having the format shown in FIG. 20. In this embodiment neighboring cell read pattern 1802 includes bits XY1, YU, XY2, XR, XY4, YD, XY3 and XL, having the respective neighboring bit locations illustrated in FIG. 6. In the present embodiment each LLR 1803 includes five bits, a first bit that is a sign bit and four additional bits that identify the numerical value of the LLR.

In the present embodiment steps 1701 and 1702 are preformed in a test lab to generate one or more two-index LLR look-up table for a particular manufacturer and design of a NAND chip 1230. Different manufacturers and different designs from a particular manufacturer will have different two-index LLR look-up tables that reflect the bit error rate of each different NAND chip design. Moreover, there can be different two-index LLR look-up tables for different periods in the lifetime of a particular NAND chip design. Step 1703 can include selecting the correct two-index look-up table and installing the two-index LLR look-up table in a nonvolatile memory controller 1905. This can be done by the manufacturer of nonvolatile memory controller 1905 prior to shipping nonvolatile memory controller 1905 to a customer, or can be done by the customer, either before or after electrically coupling NAND chips 1230 to nonvolatile memory controller so as to form nonvolatile memory system 1200.

As shown by step 1704 the method includes performing a plurality of reads of a cell of a nonvolatile memory storage module at different read voltage levels to generate a plurality of target cell hard-and-soft-decision bits associated with a bit stored in the cell. In the present embodiment, step 1704 includes performing a plurality of reads of a cell of a nonvolatile memory storage module to generate a plurality of reads associated with a bit stored in the cell; analyzing the results from the plurality of reads associated with a bit stored in the cell to identify a threshold voltage region corresponding to the threshold voltage of the bit stored in the cell; and generating a plurality of target cell hard-and-soft-decision bits corresponding to the identified threshold voltage region.

In the present embodiment, step 1704 includes performing a first read of the cell of nonvolatile memory storage module 1915 at a hard read voltage and performing a plurality of additional reads of the cell at different soft read voltage levels proximate the hard read voltage, the nonvolatile memory controller 1905 operable for analyzing the plurality of reads to generate the target cell hard-and-soft-decision bits associated with a bit stored in the cell. In the embodiment shown in FIG. 19, read circuitry 1940 is configured to perform the reads of a cell of a nonvolatile memory storage module 1915 at different read voltage levels to generate target cell hard-and-soft-decision bits associated with a bit stored in the cell.

The reads of step 1704 generate an index that identifies the threshold voltage region corresponding to the threshold voltage of the bit stored in the cell. In the present embodiment the index will have one of the three bit soft-decision bit patterns shown in FIG. 20. Read circuitry 1940 includes target cell read processing circuitry 1910 that is configured to analyze the results from the plurality of reads associated with a bit stored in the cell to identify a threshold voltage region corresponding to the threshold voltage of the bit stored in the cell and is configured to generate a plurality of target cell hard-and-soft-decision bits 1801 corresponding to the identified threshold voltage region.

Though target cell hard-and-soft-decision bits 2020 are shown to be three bits in FIG. 20, it is appreciated that target cell hard-and-soft-decision bits 2020 could include more or fewer bits. Moreover, in other embodiments of the present invention, other coding methods could be used to identify a region of the voltage distribution. In the present embodiment read circuitry 1940 is operable to send read requests to NAND chips 1930 and to analyze the results of the read requests to generate target cell hard-and-soft-decision bits 2020. Alternatively, read circuitry 1940 is operable to send requests to NAND chips 1930 and NAND chips 1930 are operable to generate target cell hard-and-soft-decision bits 2020.

As shown by step 1705 the method includes performing reads of neighboring cells. The reads of neighboring cells generate a plurality of neighboring cell reads, each of the plurality of neighboring cell reads associated with a bit stored in one of the neighboring cells. In the present embodiment read circuitry 1940 is configured for performing reads of neighboring cells to the cell of the nonvolatile memory storage module to generate a plurality of neighboring cell reads.

As shown by step 1706 the method includes combining the neighboring cell reads to generate a neighboring cell read pattern. In the present embodiment, neighboring cell read processing circuitry 1920 is configured to combine the neighboring cell reads to generate a neighboring cell read pattern that corresponds to the pattern of the neighboring cell reads.

In one exemplary embodiment that is illustrated in FIG. 22 each of the reads of neighboring cells is representative of a logical "1" or a logical "0" and combining the neighboring cell reads to generate a neighboring cell read pattern that corresponds to the pattern of the neighboring cell reads further includes concatenating the neighboring cell reads representative of a logical "1" and representative of a logical "0" to generate the neighboring cell read pattern. In the present embodiment, neighboring cell processing circuitry 1920 is configured to combine the neighboring cell reads by concatenating the neighboring cell reads representative of a logical "1" and representative of a logical "0" to generate the neighboring cell read pattern 1802. For each combination of target cell hard-and-soft-decision bits 1802 there will be 256 possible combinations of neighboring cell read patterns 1802, giving a total of 2048 different LLR values 1803.

Figure 23:
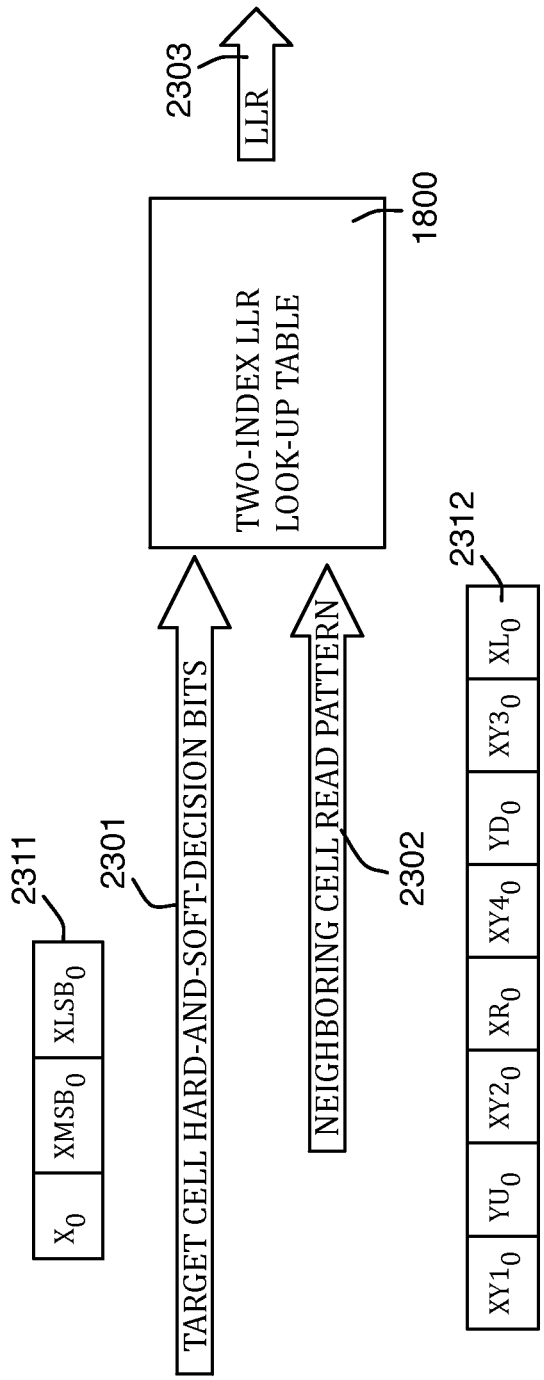
FIG. 23 is a block diagram illustrating accessing a two-index LLR look-up table to obtain a LLR value for use in LDPC decoding in accordance with an embodiment of the present invention.

As shown by step 1707 the method includes accessing the one or more look-up table using the plurality of target cell hard-and-soft-decision bits associated with a bit stored in the cell and the neighboring cell read pattern that corresponds to the pattern of the neighboring cell soft reads to identify the corresponding LLR value. In the embodiment shown in FIG. 23, step 1704 generates hard-and-soft-decision bits 2301 that can include bits $X_0$, $XMSB_0$ and $XLSB_0$ 2311 and step 1706 generates neighboring cell read pattern 2302 that can include bits $XY1_0$, $YU_0$, $XY2_0$, $XR_0$, $XY4_0$, $YD_0$, $XY3_0$ and $XL_0$ 2312 that are used to access two-index LLR look-up table 1800. More particularly, look-up circuitry 1950 is configured to access the two-index LLR look-up table(s) 1935 using the target cell hard-and-soft-decision bits 2301 associated with a bit stored in the cell and neighboring cell read pattern 2302 that corresponds to the pattern of the neighboring cell soft reads to identify the corresponding LLR 2303.

Hard-and-soft-decision bits 2301 and neighboring cell read pattern 2302 are described as being used separately to index two-index LLR look-up table in FIGS. 17-23. However, it is appreciated that the two indexes can be combined prior to step 1707 by concatenating target cell hard-and-soft decision bits and neighboring cell read pattern 2302 and the combination of the two indexes (e.g., bits X, XMSB, XLSB, XY1, YU, XY2, XR, XY4, YD, XY3 and XL) can be used to access two-index LLR look-up table 1800.

Figure 24:
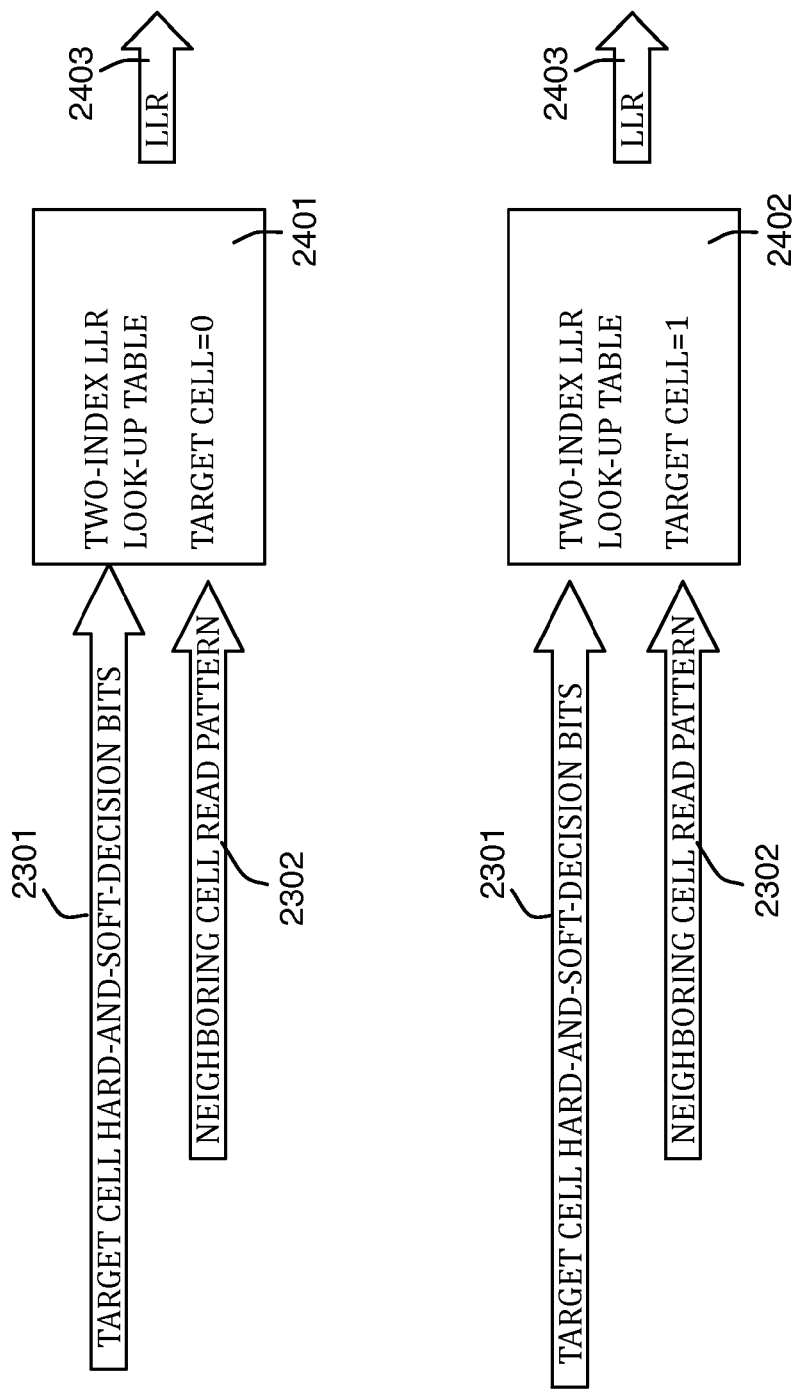
FIG. 24 is a block diagram illustrating the use of more than one two-index LLR look-up table to obtain a LLR value for use in LDPC decoding in accordance with an embodiment of the present invention.

In an alternate embodiment that is illustrated in FIG. 24, the look-up table is divided into two two-index look-up tables. Two-index LLR look up table 2401 includes target cell hard-and-soft-decision bits 1801 in which the target cell has a value of "0" and two-index LLR look up table 2402 includes target cell hard-and-soft-decision bits 1801 in which the target cell has a value of "1". Two-index LLR look-up tables 2401 and 2402 can be formed by dividing the rows of two-index look-up able 1800 according to the value of target cell hard-decision bit $X_N$, with two-index LLR look up table 2401 including those rows of LLR look-up table 1800 in which $X_N$ has a value of "0" and two-index LLR look up table 2402 including those rows of LLR look-up table 1800 in which the $X_N$ has a value of 1. In this embodiment step 1707 includes determining the value of the hard-decision bit $X_0$ stored in the target cell and using two-index LLR look up table 2301 when $X_0$ has a value of "0" and using two-index LLR look up table 2302 when $X_0$ has a value of "1."

As shown by step 1708 the method includes sending the identified LLR to a Low-Density Party Check (LDPC) decoder for decoding of a codeword. In the embodiment shown in FIGS. 13 and 19 look-up circuitry 1950 is operable to send the identified LLR to LDPC decoder 1340. LDPC decoder 1340 is configured to use the identified LLR 2303 to decode the codeword to obtain the estimated codeword 1375.

Figure 25:
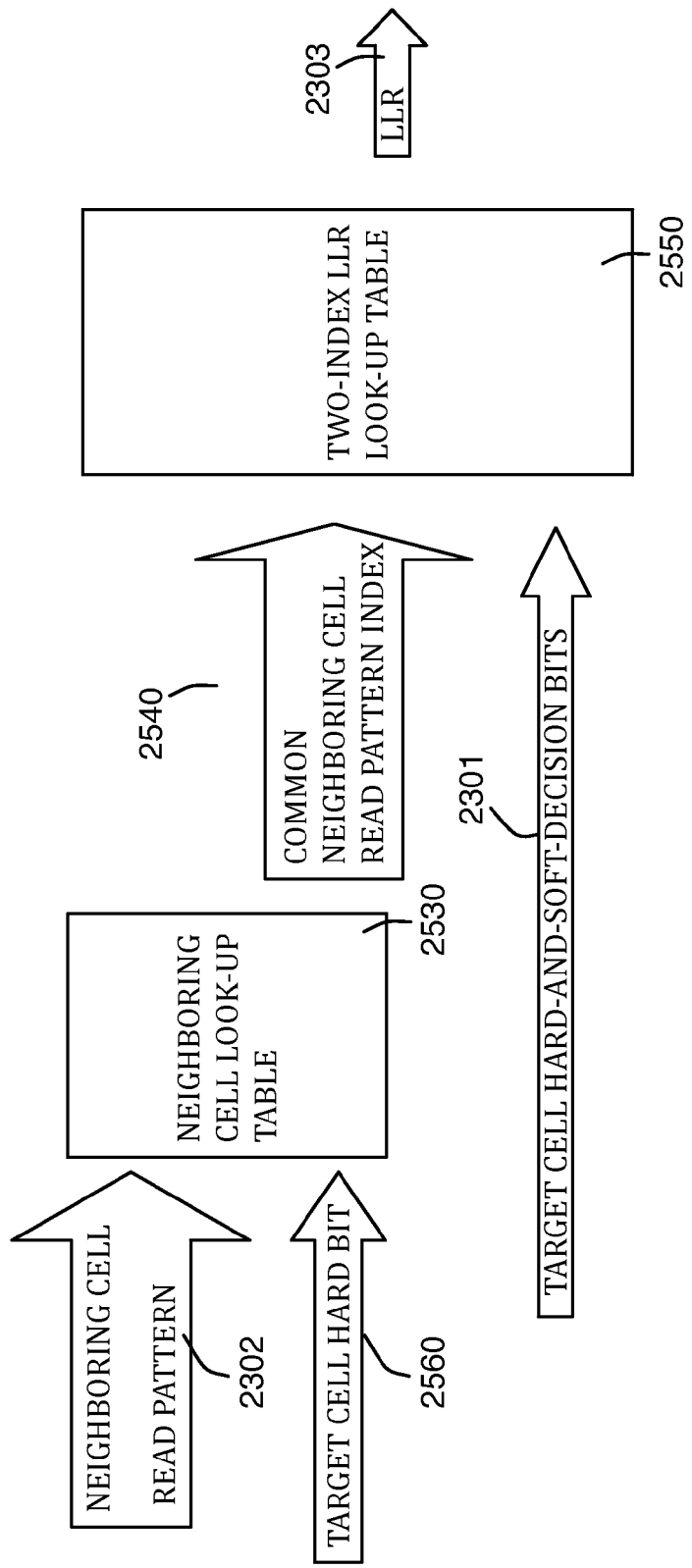
FIG. 25 is a block diagram illustrating the use of a neighboring cell pattern look-up table and a two-index LLR look-up table to obtain a LLR value for use in LDPC decoding in accordance with an embodiment of the present invention.
Figure 26:
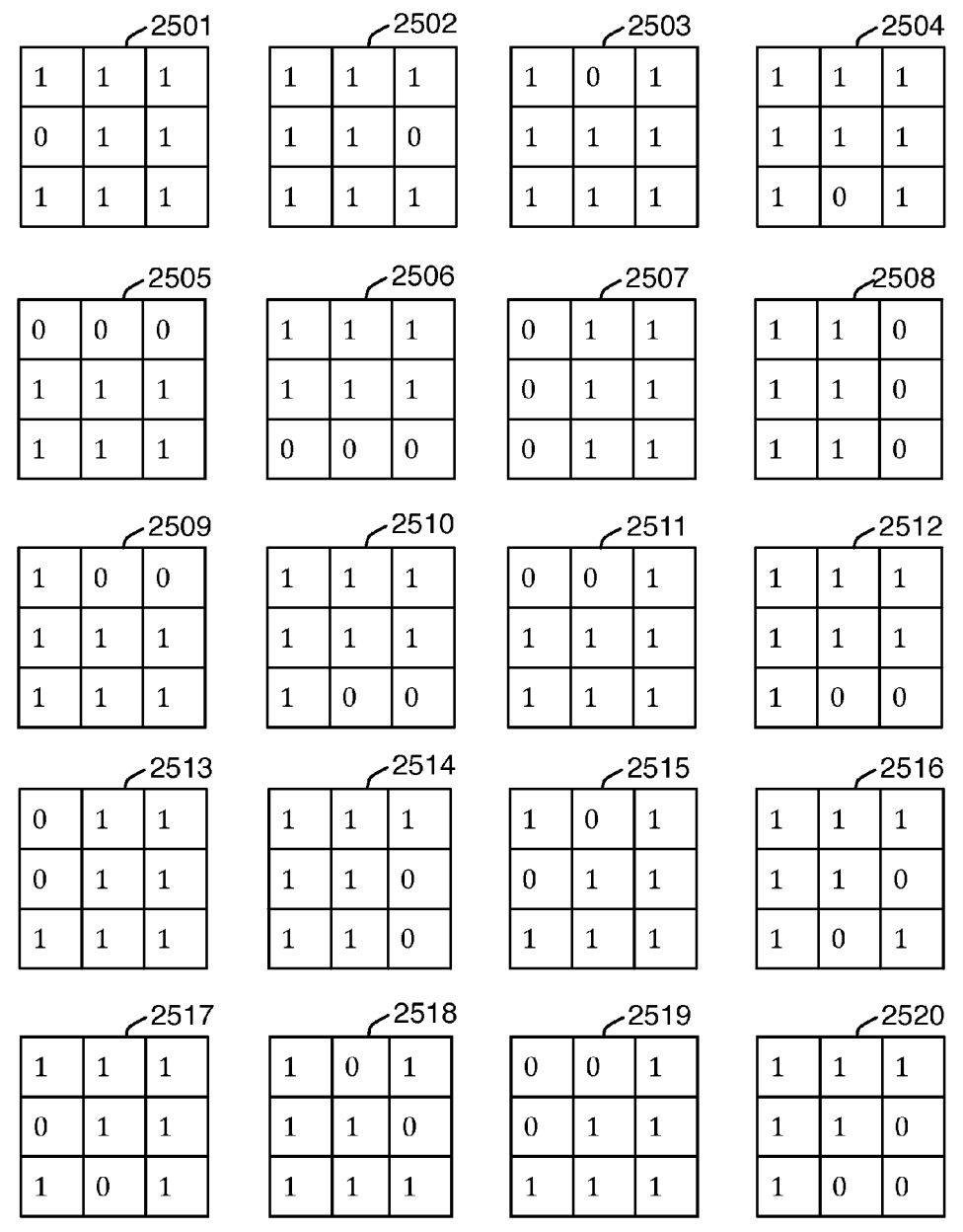

In an alternate embodiment illustrated in FIGS. 25-26 a neighboring cell pattern table 2530 is used to combine some neighboring cell patterns to reduce the size of the two-index LLR look up table 2550 used to identify the correct LLR. Neighboring cell pattern table 2530 includes all of the possible combinations of neighboring cell read patterns and provides corresponding indexes to a two-index LLR look-up table 2550 that are illustrated by common neighboring cell read pattern index 2540 shown in FIG. 25. Accordingly, some of the common neighboring cell read pattern indexes 2540 of nonvolatile memory storage module 1915 are associated with more than one neighboring cell read pattern. The neighboring cell read patterns that are combined can be patterns of neighboring cells that are horizontally symmetrical, vertically symmetrical or diagonally symmetrical patterns. For example patterns 2501 and 2502 may be combined such that they reference a single common neighboring cell read pattern index 2540 as they are vertically symmetrical (symmetrical with respect to the vertical axis), patterns 2503 and 2504 can be combined as they are horizontally symmetrical and patterns 2515 and 2516 can be combined as they are diagonally symmetrical (symmetrical about one or more diagonal axis). In the same manner patterns 2505 and 2506 can be combined, patterns 2507 and 2508 can be combined, patterns 2509 and 2510, etc. Furthermore, more than two patterns 2501-2520 can be combined such that they reference a single common neighboring cell read pattern index 2540. For Example, patterns 2501-2504 could be combined to reference a single common neighboring cell read pattern index 2540. In the present embodiment nonvolatile memory controller 1905 is configured such that look-up tables 1935 include a neighboring cell look-up table 2530 that includes the neighboring cell read patterns and corresponding indexes to a two-index LLR look-up table 2550. The common neighboring cell read pattern index 2540 is then used as a first index to access the two-index LLR table 2550, along with target cell hard-and-soft-decision bits 2301 identify the corresponding LLR 2303.

In the present embodiment neighboring cell look-up table 2530 includes both neighboring cell read patterns 2302 and target cell hard-decision bit values 2560 and is accessed using both a neighboring cell read patterns 2302 and a target cell hard-decision bit value ($X_0$) 2560. The use of the target cell hard-decision bit value in conjunction with neighboring cell read pattern 2302 allows for more precise combination of patterns than can be achieved using neighboring cell read pattern 2302 exclusively. In an alternate embodiment neighboring cell look-up table 2530 only includes neighboring cell read patterns 2302 and does not include target cell hard-decision bit values 2560, and neighboring cell read patterns 2302 are exclusively used to determine the corresponding common neighboring cell pattern index 2540.

Figure 27:
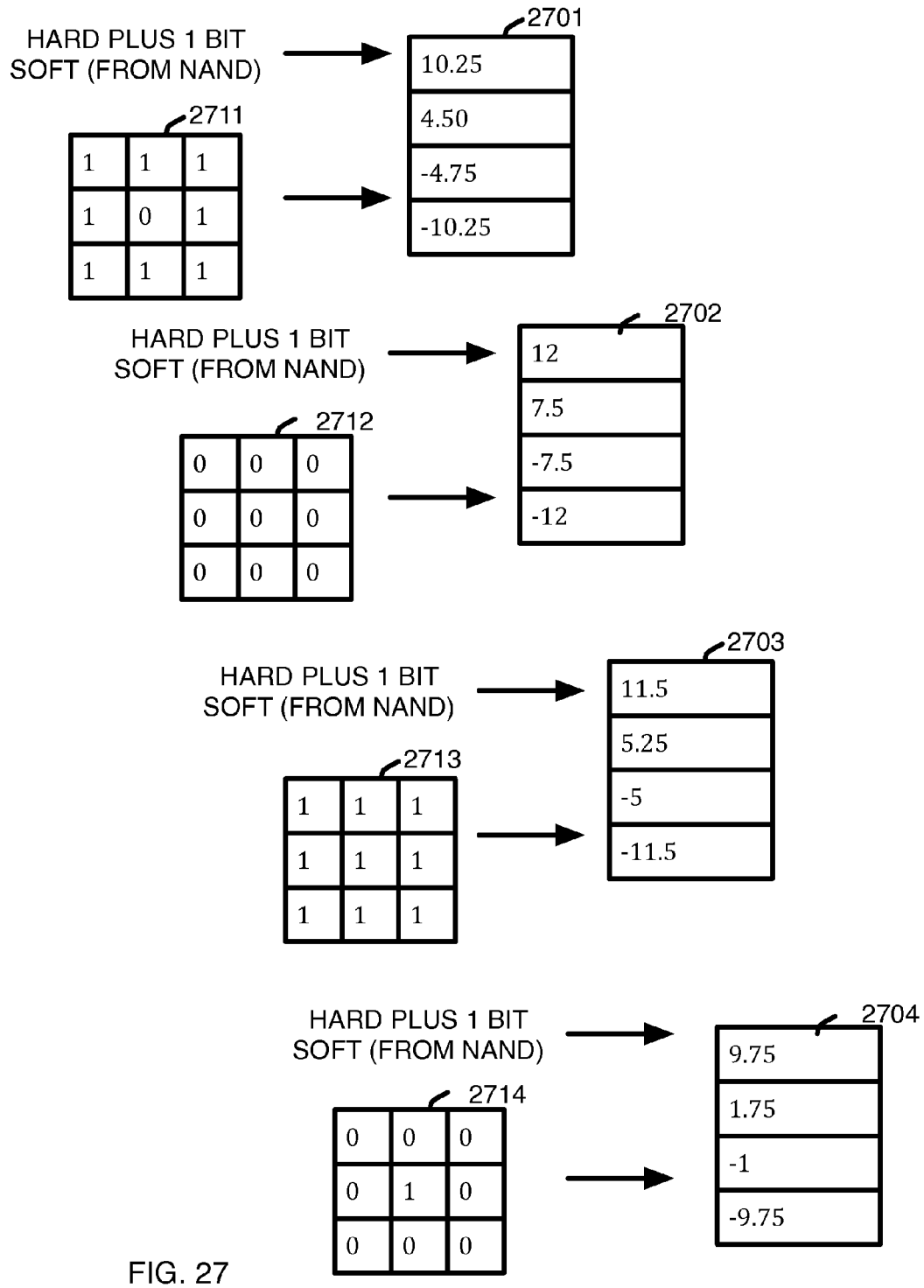
FIG. 27 is a block diagram illustrating exemplary neighboring cell patterns, target cell values and corresponding LLR values in accordance with an embodiment of the present invention.

Though hard-and-soft-decision bits 1801 are shown to include three bits in FIG. 20, it is appreciated that hard-and-soft-decision bits 1801 could include more or fewer bits. In the exemplary embodiment shown in FIG. 27 two target cell hard-and-soft-decision bits are used, a hard bit and a single soft bit, defining four regions of the voltage distribution. It can bee seen that LLR 2701 when the target cell has a hard-decision value of "0," a pattern of surrounding cells 2711 that are all 1's is 10.25 in one region, 4.50 in the second region, −4.75 in a third region and −10.25 in a fourth region of the voltage distribution. It can be seen that the LLRs 2702 when cell has a hard-decision value of "0," a pattern of surrounding cells 2712 that are all 0's is 12 in the first region, 7.50 in the second region, −7.5 in the third region and −12 in the fourth region. LLRs 2703 when the target cell has a hard-decision value of "1," a pattern of surrounding cells 2713 that are all 1's is 11.5 in the first region, 5.25 in the second region, −5 in the third region and −11.5 in the fourth region of the voltage distribution. When the target cell has a hard-decision value of "1," a pattern of surrounding cells 2714 that are all 0's, LLRs 2704 are shown to be 9.75 in the first region, 1.75 in the second region, −1 in the third region and −9.75 in the fourth region of the voltage distribution. It can be seen that the LLRs vary significantly as the surrounding cell pattern varies, illustrating that the method and apparatus of the present invention provides a high quality LLR for decoding of a codeword.

The methods and apparatus illustrated in FIGS. 17-27 are illustrated with respect to a single level cell. However, the method and apparatus of FIGS. 17-27 can also be used with NAND devices 1930 that are multi-level cell NAND devices, such as, for example, the two-bit MLC devices shown in FIG. 8.

The present invention provides an efficient method of acquiring, accumulating and processing soft information for use in LDPC decoding. The accumulation may include incrementation, concatenation, collation, shifting and various other operations, performed independently or in combination, for the generation of a look-up table index to provide an appropriate LLR to be used in the LDPC decoding.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method comprising:
    storing one or more two-index Log-Likelihood Ratio (LLR) look-up table in a memory controller, the one or more two-index LLR look-up table including a LLR, the hard-and-soft-decision bits associated with the LLR and the neighboring cell read pattern associated with the LLR;
    performing a plurality of reads of a target cell of a nonvolatile memory storage module at different read voltage levels to generate a plurality of target cell hard-and-soft-decision bits associated with a bit stored in the target cell, wherein the bit stored in the target cell is part of a codeword stored in the nonvolatile memory storage module;
    performing reads of a plurality of neighboring cells to the target cell of the nonvolatile memory storage module to generate a plurality of neighboring cell reads, each of the neighboring cells in the plurality of neighboring cells adjoining the target cell;
    combining the results of the neighboring cell reads to generate a neighboring cell read pattern that corresponds to the pattern of the neighboring cell reads; and
    accessing the one or more two-index LLR look-up table using the plurality of target cell hard-and-soft-decision bits and the generated neighboring cell read pattern to identify the corresponding LLR; and
    sending the identified LLR to a Low-Density Party Check (LDPC) decoder for decoding of the codeword stored in the nonvolatile memory storage module.

2. The method of claim 1, wherein each of the reads of neighboring cells is representative of a logical "1" or a logical "0" and combining the results of the neighboring cell reads to generate a neighboring cell read pattern further comprises, concatenating the neighboring cell reads representative of a logical "1" or representative of a logical "0" to generate the neighboring cell read pattern.

3. The method of claim 1, wherein performing a plurality of reads of a target cell of a nonvolatile memory storage module at different read voltage levels to generate a plurality of target cell hard-and-soft-decision bits further comprises generating an index that identifies the threshold voltage region corresponding to the threshold voltage of the bit stored in the target cell.

4. The method of claim 1, wherein the performing a plurality of reads of a target cell of a nonvolatile memory storage module further comprises:
    performing a plurality of reads of a target cell of a nonvolatile memory storage module to generate a plurality of reads associated with a bit stored in the target cell;
    analyzing the results from the plurality of reads of the target cell to identify a threshold voltage region corresponding to the threshold voltage of the bit stored in the target cell; and
    generating the plurality of target cell hard-and-soft-decision bits corresponding to the identified threshold voltage region.

5. The method of claim 1, wherein performing a plurality of reads of a target cell of a nonvolatile memory storage module comprises performing a first read of the target cell at a hard-decision reference voltage level and performing a plurality of additional reads of the target cell at soft-decision reference voltage levels proximate the hard-decision reference voltage level, the memory controller operable for analyzing the plurality of reads to generate the plurality of target cell hard-and-soft-decision bits associated with a bit stored in the cell.

6. The method of claim 1 further comprising:
    performing a first read of the target cell of a nonvolatile memory storage module cell at a hard-decision reference voltage and performing a plurality of additional reads of the target cell at soft-decision reference voltages following the first read of the target cell; and
    wherein the one or more two-index LLR look-up table comprises a first two-index LLR look-up table corresponding to a first state of the target cell and a second two-index LLR look-up table corresponding to a second state of the target cell, the accessing the one or more two-index LLR look-up table further comprising indexing the first two-index LLR look-up table when the first read of the target cell indicates that the target cell has the first state and indexing the second two-index LLR look-up table when the first read of the target cell indicates that the cell has the second state.

7. The method of claim 1, wherein performing reads of a plurality of neighboring cells further comprises performing a read of all cells adjoining the target cell, the method further comprising:
    reading test memory cells of one or more test nonvolatile memory device to identify a LLR corresponding to each possible pattern of reads of a test memory cell and neighboring memory cells, the test memory cell read at the plurality of different voltage levels; and
    storing each identified LLR value, the target cell hard-and-soft-decision bits associated with the identified LLR and the neighboring cell read pattern associated with the identified LLR in the one or more two-index LLR look-up table.

8. The method of claim 1, further comprising concatenating the results of the neighboring cell reads and the target cell hard-and-soft-decision bits and wherein the accessing the one or more two-index LLR look-up table further comprises accessing the one or more two-index LLR look-up table using the combined plurality of target cell hard-and-soft-decision bits corresponding to the identified threshold voltage region and the generated neighboring cell read pattern to identify the corresponding LLR for use in LDPC decoding of a codeword stored in the nonvolatile memory storage module.

9. The method of claim 1, further comprising a neighboring cell look-up table that includes the neighboring cell read patterns, hard-decision bits, and corresponding common neighboring cell read pattern indexes to the two-index LLR look-up table, at least some of the common neighboring cell read pattern indexes associated with more than one neighboring cell read pattern, each LLR in the two-index LLR look-up table associated with one of the common neighboring cell read pattern indexes and one set of hard-and-soft-decision bit values.

10. A nonvolatile memory controller comprising:
  memory storage configured to store one or more two-index Log-Likelihood Ratio (LLR) look-up table that includes a LLR, hard-and-soft decision bits associated with the LLR and a neighboring cell read pattern associated with the LLR;
  read circuitry configured to perform a plurality of reads of a target cell of a nonvolatile memory storage module at different read voltage levels to generate a plurality of target cell hard-and-soft-decision bits associated with a bit stored in the target cell and configured for performing reads of a plurality of neighboring cells to the target cell of the nonvolatile memory storage module to generate a plurality of neighboring cell reads, each of the neighboring cells in the plurality of neighboring cells adjoining the target cell, wherein the bit stored in the target cell is part of a codeword stored in the nonvolatile memory storage module;
  neighboring cell processing circuitry configured to combine the results of the neighboring cell reads to generate a neighboring cell read pattern that corresponds to the pattern of the neighboring cell reads; and
  look-up circuitry coupled to the neighboring cell circuitry and the read circuitry, the look-up circuitry configured to access the one or more two-index LLR look-up table using the plurality of target cell hard-and-soft-decision bits and the generated neighboring cell read pattern to identify the corresponding LLR for use in LDPC decoding of the codeword stored in the nonvolatile memory storage module.

11. The nonvolatile memory controller of claim 10, wherein the neighboring cell processing circuitry is configured to concatenate values indicating the results from each of the neighboring cell reads to generate the neighboring cell read pattern.

12. The nonvolatile memory controller of claim 11, wherein the look-up circuitry is configured to index the one or more two-index LLR look-up table using the plurality of target cell hard-and-soft-decision bits as a first index and the generated neighboring cell read pattern as a second index, to identify the corresponding LLR for use in LDPC decoding of the codeword stored in the nonvolatile memory storage module.

13. The nonvolatile memory controller of claim 12, wherein each of the reads of neighboring cells is representative of a logical "1" or a logical "0" and wherein the neighboring cell processing circuitry is further configured to combine the results of the neighboring cell reads by concatenating the neighboring cell reads representative of a logical "1" or representative of a logical "0" to generate the neighboring cell read pattern.

14. The nonvolatile memory controller of claim 11 wherein the read circuitry is configured to perform a first read of the target cell at a hard-decision reference voltage and perform a plurality of additional reads of the target cell following the first read of the target cell at soft-decision reference voltages; and
  wherein the at least one two-index LLR look-up table comprises a first two-index LLR look-up table corresponding to a first state of the target cell and a second two-index LLR look-up table corresponding to a second state of the target cell, the indexing the one or more two-index LLR look-up table further comprising indexing the first two-index LLR look-up table when the first read of the target cell indicates that the target cell has the first state and indexing the second two-index LLR look-up table when the first read of the target cell indicates that the target cell has the second state.

15. The nonvolatile memory controller of claim 11 wherein the one or more two-index LLR look-up table includes a LLR, the soft reads bits associated with the LLR and the neighboring cell read pattern associated with the LLR for all possible combinations of target cell hard-and-soft-decision bits and neighboring cell read patterns.

16. The nonvolatile memory controller of claim 11 wherein the one or more two-index LLR look-up table further comprises a neighboring cell look-up table that includes the neighboring cell read patterns, hard-decision bits and corresponding common neighboring cell read pattern indexes to the two-index LLR look-up table, at least some of the common neighboring cell read pattern indexes associated with more than one neighboring cell read pattern, each LLR in the two-index LLR look-up table associated with one of the common neighboring cell read pattern indexes and one set of hard-and-soft-decision bit values.

17. The nonvolatile memory controller of claim 16 wherein the cell is a Multi-Level Cell (MLC).

18. A system comprising:
  a LDPC (Low-Density Parity Check) encoder configured to generate a codeword;
  a nonvolatile memory storage module configured to store the codeword;
  memory storage configured to store one or more Log-Likelihood Ratio (LLR) look-up table that includes a LLR, soft reads bits associated with the LLR and a neighboring cell read pattern associated with the LLR;
  read circuitry configured to perform a plurality of reads of a target cell of the nonvolatile memory storage module at different read voltage levels to generate a plurality of target cell hard-and-soft-decision bits associated with a bit of the codeword that is stored in the target cell and configured for performing reads of a plurality of neighboring cells to the target cell of the nonvolatile memory storage module to generate a plurality of neighboring cell reads, each of the neighboring cells in the plurality of neighboring cells adjoining the target cell;
  neighboring cell processing circuitry configured to combine the results of the neighboring cell reads to generate a neighboring cell read pattern that corresponds to the pattern of the neighboring cell reads;
  look-up circuitry coupled to the neighboring cell processing circuitry and the read circuitry, the look-up circuitry configured to access the one or more LLR look-up table using the plurality of target cell hard-and-soft-decision bits and the generated neighboring cell read pattern to identify the corresponding LLR; and a LDPC decoder coupled to the look-up circuitry, the LDPC decoder configured to use the identified LLR to decode the codeword.

19. The system of claim 18, wherein the read circuitry further comprises read processing circuitry configured to analyze the results from the plurality of reads of the target cell to identify a threshold voltage region corresponding to the threshold voltage of the bit stored in the target cell and configured to generate the plurality of target cell hard-and-soft-decision bits corresponding to the identified threshold voltage region.

20. The system of claim 19, wherein the cell is a Multi-Level Cell (MLC).

\* \* \* \* \*